United States Patent
Jo et al.

(10) Patent No.: US 9,589,945 B2
(45) Date of Patent: Mar. 7, 2017

(54) SEMICONDUCTOR PACKAGE HAVING STACKED SEMICONDUCTOR CHIPS

(71) Applicant: SAMSUNG ELECTRONICS CO., LTD., Suwon-Si, Gyeonggi-Do (KR)

(72) Inventors: Cha-jea Jo, Incheon (KR); Yun-hyeok Im, Gyeonggi-do (KR); Tae-je Cho, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/804,880

(22) Filed: Jul. 21, 2015

(65) Prior Publication Data

US 2016/0093598 A1    Mar. 31, 2016

(30) Foreign Application Priority Data

Sep. 29, 2014  (KR) .................. 10-2014-0130335

(51) Int. Cl.
| | |
|---|---|
| H01L 25/18 | (2006.01) |
| H01L 23/367 | (2006.01) |
| H01L 23/48 | (2006.01) |
| H01L 25/065 | (2006.01) |
| H01L 23/36 | (2006.01) |
| H01L 23/427 | (2006.01) |
| H01L 23/532 | (2006.01) |
| H01L 23/31 | (2006.01) |

(52) U.S. Cl.
CPC ............. *H01L 25/18* (2013.01); *H01L 23/36* (2013.01); *H01L 23/481* (2013.01); *H01L 25/0652* (2013.01); *H01L 23/3128* (2013.01); *H01L 23/427* (2013.01); *H01L 23/53223* (2013.01); *H01L 23/53233* (2013.01); *H01L 23/53238* (2013.01); *H01L 23/53252* (2013.01); *H01L 23/53266* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2225/06589* (2013.01); *H01L 2924/15311* (2013.01); *H01L 2924/16195* (2013.01)

(58) Field of Classification Search
CPC ... H01L 25/18; H01L 23/481; H01L 25/0652; H01L 23/3185; H01L 23/3675; H01L 2225/06541; H01L 2225/06589; H01L 2225/06513; H01L 2225/06517
USPC ....... 257/713, 712, 686, 685, 723, 728, 778, 257/737, 738, 779, 782, 774, 773, 775, 257/776
See application file for complete search history.

(56) References Cited

U.S. PATENT DOCUMENTS

| | | |
|---|---|---|
| 5,616,517 A | 4/1997 | Wen et al. |
| 6,282,094 B1 | 8/2001 | Lo et al. |

(Continued)

*Primary Examiner* — Alexander Oscar Williams
(74) *Attorney, Agent, or Firm* — F. Chau & Associates, LLC

(57) ABSTRACT

A semiconductor package includes a package base substrate, at least one first semiconductor chip disposed on the package base substrate, and at least one stacked semiconductor chip structure disposed on the package base substrate adjacent to the at least one first semiconductor chip. The at least one stacked semiconductor chip includes a plurality of second semiconductor chips. A penetrating electrode region including a plurality of penetrating electrodes is disposed adjacent to an edge of the at least one stacked semiconductor chip structure.

16 Claims, 17 Drawing Sheets

(56) References Cited

U.S. PATENT DOCUMENTS

| | | |
|---|---|---|
| 7,638,874 B2 | 12/2009 | Chiu et al. |
| 7,872,869 B2 | 1/2011 | Lee et al. |
| 8,017,439 B2 | 9/2011 | Takahashi et al. |
| 8,129,224 B2 | 3/2012 | Gurrum et al. |
| 8,505,613 B2 | 8/2013 | Chrysler et al. |
| 8,633,597 B2 | 1/2014 | Sweeney et al. |
| 8,704,352 B2 | 4/2014 | Hisano et al. |
| 8,710,625 B2 | 4/2014 | Fedorov et al. |
| 2005/0189639 A1* | 9/2005 | Tanie ............... H01L 25/0657 257/686 |
| 2008/0054436 A1* | 3/2008 | Baek ................. H01L 23/367 257/686 |
| 2009/0084931 A1 | 4/2009 | Sauciuc et al. |
| 2009/0305463 A1 | 12/2009 | Bartley et al. |
| 2010/0328899 A1 | 12/2010 | Dimitrakopoulos et al. |
| 2012/0051392 A1 | 3/2012 | Grillberger et al. |
| 2013/0099368 A1* | 4/2013 | Han ................... H01L 23/473 257/692 |
| 2013/0277821 A1 | 10/2013 | Lundberg |
| 2014/0131891 A1* | 5/2014 | Ishihara ............ H01L 23/481 257/774 |
| 2014/0168902 A1* | 6/2014 | Park .................. H01L 23/367 361/719 |
| 2014/0192835 A1 | 7/2014 | Caroff et al. |
| 2015/0010269 A1* | 1/2015 | Jo ....................... G02B 6/43 385/14 |
| 2015/0262878 A1* | 9/2015 | Sato ................... H01L 25/074 257/777 |

\* cited by examiner

SEMICONDUCTOR PACKAGE HAVING STACKED SEMICONDUCTOR CHIPS

CROSS-REFERENCE TO RELATED APPLICATION

This application claims priority under 35 U.S.C. §119 to Korean Patent Application No. 10-2014-0130335, filed on Sep. 29, 2014, in the Korean Intellectual Property Office, the disclosure of which is incorporated by reference herein in its entirety.

TECHNICAL FIELD

Exemplary embodiments of the present inventive concept relate to a semiconductor package, and more particularly, to a semiconductor package including a plurality of stacked semiconductor chips.

DISCUSSION OF RELATED ART

With the rapid developments in the electronic industry and the demand of users, electronic devices are becoming more compact, light, and multifunctional. Accordingly, a semiconductor package including a memory semiconductor chip and a microprocessor unit (MPU)/graphics processing unit (GPU) semiconductor chip is being developed. To increase the capacity of memory included in a semiconductor package, a plurality of memory semiconductor chips may be stacked using penetrating electrodes.

However, as different types of semiconductor chips are included in a single semiconductor package, the amount of heat generated by an internal portion of the semiconductor package may increase.

SUMMARY

Exemplary embodiments of the present inventive concept provide a semiconductor package including different types of semiconductor chips. The semiconductor package may discharge heat that is generated by the semiconductor package to the outside of the semiconductor package.

According to an exemplary embodiment of the present inventive concept, there is provided a semiconductor package including a package base substrate, at least one first semiconductor chip disposed on the package base substrate, and at least one stacked semiconductor chip structure disposed on the package base substrate adjacent to the at least one first semiconductor chip. The at least one stacked semiconductor chip includes a plurality of second semiconductor chips. A penetrating electrode region including a plurality of penetrating electrodes is disposed adjacent to an edge of the at least one stacked semiconductor chip structure.

The semiconductor package may include a package molding layer disposed on the package base substrate. The package molding layer may cover a side surface of the at least one first semiconductor chip and a side surface of the at least one stacked semiconductor chip structure but not an upper surface of the at least one first semiconductor chip and an upper surface of the at least one stacked semiconductor chip structure. The upper surface of the at least one first semiconductor chip may be on the same level as the upper surface of the at least one stacked semiconductor chip structure.

The semiconductor package may include a heat dissipation member disposed on the at least one first semiconductor chip and the at least one stacked semiconductor chip structure. A thermal interface material (TIM) layer may be disposed between the heat dissipation member and the at least one first semiconductor chip and the at least one stacked semiconductor chip structure.

The plurality of penetrating electrodes disposed on an uppermost semiconductor chip among the plurality of second semiconductor chips may be in contact with the TIM layer.

The penetrating electrode region may be adjacent to an edge of the at least one stacked semiconductor chip structure that is opposite to an edge of the at least one first semiconductor chip.

The at least one stacked semiconductor chip structure may include first and second stacked semiconductor chip structures. An edge of the first stacked semiconductor chip structure and an edge of the second stacked semiconductor chip structure may face two opposite edges of the at least one first semiconductor chip, respectively.

The at least one stacked semiconductor chip structure may include first through fourth stacked semiconductor chip structures. Edges of the first through fourth stacked semiconductor chip structures may face four edges of the at least one first semiconductor chip, respectively.

The penetrating electrode region may be adjacent to at least one of two edges that meet at a vertex of the at least one stacked semiconductor chip structure that faces an edge of the at least one first semiconductor chip.

The at least one stacked semiconductor chip structure may include first through fourth stacked semiconductor chip structures. The first through fourth stacked semiconductor chip structures may each have vertexes that respectively face four edges of the at least one first semiconductor chip.

The penetrating electrode region may have an L shape. The L shaped penetrating electrode region may be adjacent to two edges of the at least one stacked semiconductor chip structure that meet at a vertex. The vertex may be opposite to an edge of the at least one first semiconductor chip.

The at least one first semiconductor chip may be a microprocessor unit (MPU) or a graphics processing unit (GPU).

The plurality of second semiconductor chips may be memory semiconductor chips.

The plurality of second semiconductor chips may include a logic semiconductor chip and a plurality of memory semiconductor chips stacked on the logic semiconductor chip.

An area of the logic semiconductor chip may be greater than an area of each of the plurality of memory semiconductor chips.

The at least one stacked semiconductor chip structure may include a sub-package molding layer disposed on the logic semiconductor chip. The sub-package molding layer may cove side surfaces of the plurality of memory semiconductor chips but not an upper surface of an uppermost memory semiconductor chip among the plurality of memory semiconductor chips.

The at least one first semiconductor chip may be configured to generate a larger amount of heat per unit area than each of the plurality of second semiconductor chips.

According to an exemplary embodiment of the present inventive concept, there is provided a semiconductor package including a package base substrate, at least one sub-semiconductor package disposed on the package base substrate including a first semiconductor chip, and at least one stacked semiconductor chip structure disposed on the package base substrate adjacent to the at least one sub-semiconductor package. The at least one stacked semiconductor includes a plurality of second semiconductor chips. Each of the plurality of second semiconductor chips includes a penetrating electrode region. A plurality of penetrating electrodes is disposed in the penetrating electrode region. A package molding layer is disposed on the package base substrate. The package molding layer covers a side surface of the at least one sub-semiconductor package and a side surface of the at least one stacked semiconductor chip structure. A heat dissipation member is disposed on the at least one sub-semiconductor package and the at least one stacked semiconductor chip structure. A thermal interface material (TIM) layer is disposed between the heat dissipation member and the at least one sub-semiconductor package and the at least one stacked semiconductor chip structure. The penetrating electrode region is adjacent to an edge of the at least one stacked semiconductor chip structure that is adjacent to an edge of the at least one first semiconductor chip.

The penetrating electrode region may be adjacent to two opposite edges of the at least one stacked semiconductor chip structure. The at least one sub-semiconductor package may include a first sub-semiconductor package and a second sub-semiconductor package that are respectively adjacent to the two opposite edges of the at least one stacked semiconductor chip structure.

The penetrating electrode region may be adjacent to four edges of the at least one stacked semiconductor chip structure. The at least one sub-semiconductor package may include first through fourth semiconductor packages that are respectively adjacent to the four edges of the at least one stacked semiconductor chip structure.

The at least one stacked semiconductor chip structure may include a first stacked semiconductor chip structure and a second stacked semiconductor chip structure that are respectively adjacent to two opposite edges of the at least one sub-semiconductor package.

The at least one stacked semiconductor chip structure may include first through fourth stacked semiconductor chip structures that are respectively adjacent to four edges of the at least one sub-semiconductor package.

The at least one sub-semiconductor package may include a sub-package base substrate. The first semiconductor chip may be disposed on the sub-package base substrate. A sub-package molding layer may be disposed on the sub-package base substrate. The sub-package molding layer may cover a side surface of the first semiconductor chip but not an upper surface of the first semiconductor chip.

The upper surface of the first semiconductor chip may be on the same level as an upper surface of an uppermost semiconductor chip among the plurality of second semiconductor chips.

The TIM layer may be in contact with the upper surface of the first semiconductor chip and the upper surface of the uppermost semiconductor chip among the plurality of second semiconductor chips.

The plurality of second semiconductor chips may include a logic semiconductor chip and a plurality of DRAM semiconductor chips stacked on the logic semiconductor chip. The logic semiconductor chip may be a controller chip for controlling the plurality of DRAM semiconductor chips.

According to an exemplary embodiment of the present inventive concept, there is provided a semiconductor package including a package base substrate, and a first semiconductor chip disposed on the package base substrate. A plurality of second semiconductor chips is disposed on the package base substrate adjacent to the first semiconductor chip. Each of the plurality of second semiconductor chips is vertically stacked. Each of the plurality of second semiconductor chips is electrically connected to one another via a plurality of penetrating electrodes. A molding layer is disposed on the package base substrate. The molding layer covers a side surface of the first semiconductor chip and side surfaces of the plurality of the second semiconductor chips. A heat dissipation member is disposed on the molding layer. The plurality of penetrating electrodes is disposed along respective edges of the plurality of second semiconductor chips that are adjacent to the first semiconductor chip.

The plurality of penetrating electrodes may be disposed along respective edges of the plurality of second semiconductor chips that are opposite to an edge of the first semiconductor chip.

The molding layer might not cover an upper surface of the first semiconductor chip and an upper surface of an uppermost semiconductor chip among the plurality of second semiconductor chips that are on the same level as each other with respect to the package base substrate. The heat dissipation member may be disposed on the first semiconductor chip and the plurality of second semiconductor chips. A thermal interface material (TIM) layer may be disposed between the heat dissipation member and the first semiconductor chip and the plurality of second semiconductor chips.

The plurality of penetrating electrodes may be electrically insulated from the heat dissipation member by the TIM layer.

The plurality of penetrating electrodes may provide at least one selected from a signal, power, or ground for the plurality of second semiconductor chips.

BRIEF DESCRIPTION OF THE DRAWINGS

The above and other features of the inventive concept will become more apparent by describing in detail exemplary embodiments thereof, with reference to the accompanying drawings in which.

DETAILED DESCRIPTION OF THE EMBODIMENTS

Exemplary embodiments of the present inventive concept will now be described more fully with reference to the accompanying drawings, in which exemplary embodiments of the present inventive concept are shown. Exemplary embodiments of the present inventive concept may, however, be embodied in many different forms and should not be construed as being limited to the embodiments set forth herein. In the specification and drawings, lengths and sizes of components may be exaggerated, and a ratio between the sizes of components may be enlarged or reduced.

It will be understood that when a component is referred to as being "on" another component or as "contacting" another component, the component may be directly on or may directly contact another component or intervening components may be present.

While such terms as "first", or "second" may be used to describe various components, such components should not be limited to the above terms.

An expression used in the singular form may encompass the expression in the plural form, unless it has a clearly different meaning in the context.

The terms "edge" and "vertex" may respectively refer to an edge and a vertex of a two-dimensional (2D) component in a planar view.

Figure 1:
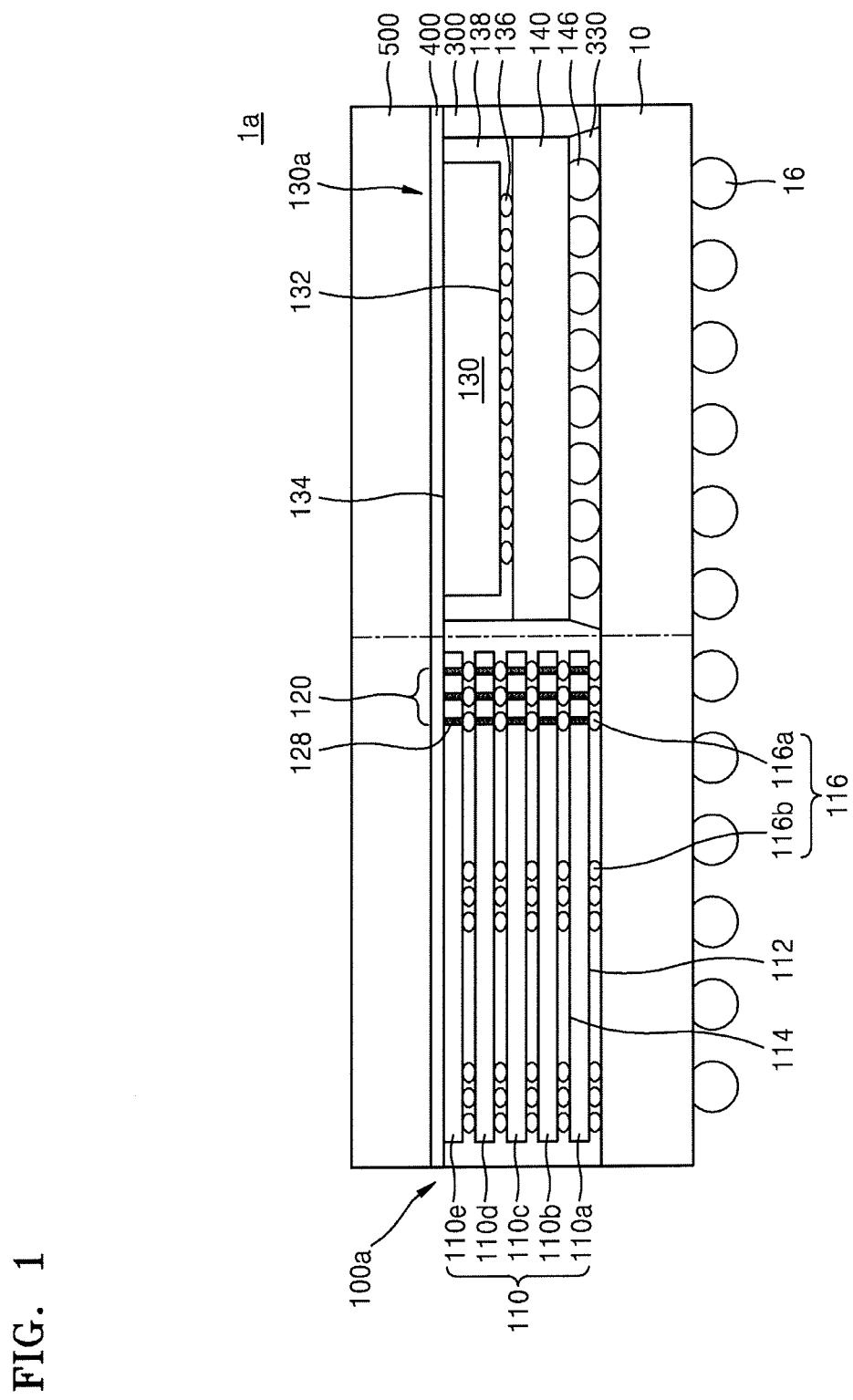
FIG. 1 is a cross-sectional view of a semiconductor package according to an exemplary embodiment of the present inventive concept.

FIG. 1 is a cross-sectional view of a semiconductor package according to an exemplary embodiment of the present inventive concept.

Referring to FIG. 1, a semiconductor package 1a may include a package base substrate 10, a sub-semiconductor package 130a, and a stacked semiconductor chip structure 100a. The sub-semiconductor package 130a and the stacked semiconductor chip structure 100a may be disposed on the package base substrate 10 adjacent to each other.

The package base substrate 10 may be, for example, a printed circuit board (PCB), a ceramic substrate, or an interposer.

When the package base substrate 10 is a PCB, the package base substrate 10 may include a substrate base, and an upper pad and a lower pad respectively disposed on an upper surface and a bottom surface of the substrate base. The upper pad and the lower pad may be respectively exposed via solder resist layers respectively disposed on the upper surface and the lower surface of the substrate base. The substrate base may include phenol resin, epoxy resin, and/or polyimide. For example, the substrate base may include FR4, tetrafunctional epoxy, polyphenylene ether, epoxy/polyphenylene oxide, bismaleimide triazine (BT), thermount, cyanate ester, polyimide, and/or liquid crystal polymer. The upper pad and the lower pad may include copper (Cu), nickel, stainless steel, or beryllium Cu. An internal wiring that electrically connects the upper pad to the lower pad may be disposed within the substrate base. The upper pad and the lower pad may be portions of circuit wirings that are respectively exposed via the solder resist layers. The circuit wirings may be formed by coating the upper surface and the lower surface of the substrate base with a Cu foil and then patterning the Cu foil.

When the package base substrate 10 is an interposer, the package base substrate 10 may include a substrate base including a semiconductor material, and the upper pad and the lower pad respectively disposed on the upper surface and the bottom surface of the substrate base. The substrate base may include, for example, a silicon wafer. An internal wiring may be disposed on the upper surface of the substrate base, on the lower surface thereof, or within the substrate base. A through via that electrically connects the upper pad to the lower pad may be formed within the substrate base.

External connection ports 16 may be disposed on the lower surface of the package base substrate 10. The external connection ports 16 may be disposed on the lower pad. The external connection ports 16 may be, for example, bumps or solder balls. The external connection ports 16 may connect the semiconductor package 1a to an external device. For example, the external connection ports 16 may electrically connect the semiconductor package 1a to an external device.

The sub-semiconductor package 130a may include a sub-package base substrate 140 and a first semiconductor chip 130 disposed on the sub-package base substrate 140. The first semiconductor chip 130 may be disposed on the sub-package base substrate 140. An active surface 132 of the first semiconductor chip 130 may face the sub-package base substrate 140. The first semiconductor chip 130 may be connected to the sub-package base substrate 140. For example, the first semiconductor chip 130 may be electrically connected to the sub-package base substrate 140 via first connection ports 136 disposed on the active surface 132. The first connection ports 136 may be, for example, bumps or solder balls. The sub-semiconductor package 130a may include a first sub-package molding layer 138 disposed on the sub-package base substrate 140. The sub-package molding layer 138 may cover a lateral surface of the first semiconductor chip 130. The first sub-package molding member 138 might not cover an upper surface, for example, an inactive surface 134, of the first semiconductor chip 130. The first sub-package molding member 138 may fill a space between the first semiconductor chip 130 and the sub-package base substrate 140. The first sub-package molding member 138 may include, for example, an epoxy mold compound (EMC). The first sub-package molding layer 138 may be formed together with a package molding layer 300, which will be described in more detail.

The sub-package base substrate 140 may be, for example, a PCB. When the sub-package base substrate 140 is a PCB, the sub-package base substrate 140 may include similar components to the components of the package base substrate 10 when the package base substrate 10 is a PCB and repetitious descriptions of similar components may be omitted.

First internal connection ports 146 may be disposed on a lower surface of the sub-package base substrate 140. The first internal connection ports 146 may be, for example, bumps or solder balls. The first internal connection ports 146 may connect the sub-semiconductor package 130a to the package base substrate 10. For example, the first internal connection ports 146 may electrically connect the sub-semiconductor package 130a to the package base substrate 10. A first underfill material layer 330 may fill a space between the sub-semiconductor chip 130a and the package base substrate 10. The first underfill material layer 330 may include epoxy resin, for example. The first underfill material layer 330 may be a portion of the package molding layer 300, which may include, for example, molded under-fill (MUF).

A semiconductor substrate included in the first semiconductor chip 130 may include, for example, silicon (Si). Alternatively, the semiconductor substrate included in the first semiconductor chip 130 may include a semiconductor, such as, germanium (Ge), or a compound semiconductor, such as, Si carbide (SiC), gallium arsenide (GaAs), indium arsenide (InAs), or indium phosphide (InP). The semiconductor substrate included in the first semiconductor chip 130 may have a silicon-on-insulator (SOI) structure. For example, the semiconductor substrate included in the first semiconductor chip 130 may include a buried oxide (BOX) layer. The semiconductor substrate used included in the first semiconductor chip 130 may include a conductive region. The conductive region may be, for example, an impurity-doped well. The semiconductor substrate included in the first semiconductor chip 130 may have various isolation structures. The isolation structures may include a shallow trench isolation (STI) structure.

The first semiconductor chip 130 may include a semiconductor device including one or more individual devices. The individual devices may include one or more microelectronic devices, for example, a metal-oxide-semiconductor field effect transistor (MOSFET) (e.g., a complementary metal-oxide-semiconductor (CMOS) transistor, a system large scale integration (LSI) device, an image sensor (e.g., a CMOS imaging sensor (CIS)), a micro-electro-mechanical system (MEMS) component, an active device, and/or a passive device. The individual devices may be electrically connected to the conductive region of the semiconductor substrate included in the first semiconductor chip 130. The semiconductor device may include a conductive wiring or a conductive plug that electrically connects at least two of the individual devices to each other or electrically connects the individual devices to the conductive region of the semiconductor substrate included in first semiconductor chip 130. The individual devices may be electrically separated from their adjacent individual devices by insulation layers, respectively.

The first semiconductor chip 130 may include a processor unit. The first semiconductor chip 130 may include, for example, a microprocessor unit (MPU) or a graphics processing unit (GPU). The sub-semiconductor package 130a may include, for example, a known good package (KGP).

The stacked semiconductor chip structure 100a may include a plurality of second semiconductor chips 110. The plurality of second semiconductor chips 110 may be sequentially stacked. The plurality of second semiconductor chips 110 may include semiconductor chips 110a, 110b, 110c, 110d, and 110e. Semiconductor chips 110a, 110b, 110c, 110d, and 110e may be stacked in a vertical direction. The semiconductor substrate may be included in each of the plurality of semiconductor chips 110a, 110b, 110c, 110d, and 110e. The semiconductor device may be included in each of the plurality of semiconductor chips 110a, 110b, 110c, 110d, and 110e. The semiconductor substrate and the semiconductor device included in each of the semiconductor chips 110a, 110b, 110c, 110d, and 110e may be the same or similar to the semiconductor substrate and the semiconductor device included the first semiconductor chip 130, and thus more detailed descriptions thereof will be omitted. In each of the plurality of semiconductor chips 110a, 110b, 110c, 110d, and 110e, an active surface 112 may face the package base substrate 10.

According to exemplary embodiments of the present invention, the phrase 'a plurality of second semiconductor chips' may refer to semiconductor chips that are vertically stacked to form a single stacked semiconductor chip structure. Accordingly, when there are at least two stacked semiconductor chip structures, each stacked semiconductor chip structure may include a plurality of the second semiconductor chips 110. Unless otherwise indicated, when a plurality of second semiconductor chips are referred to, this does not indicate all of the second semiconductor chips 110 included in at least two stacked semiconductor chip structures, but indicates only the second semiconductor chips 110 included in a single stacked semiconductor chip structure. One stacked semiconductor chip structure in which a plurality of second semiconductor chips 110 is vertically stacked may be treated like a single semiconductor chip.

Each of the plurality of second semiconductor chips 110 may be, for example, a memory semiconductor chip. The memory semiconductor chip may be, for example, a volatile memory semiconductor chip, such as Dynamic Random Access Memory (DRAM) or Static Random Access Memory (SRAM), or a non-volatile memory semiconductor chip, such as Phase-change Random Access Memory (PRAM), Magnetoresistive Random Access Memory (MRAM), Ferroelectric Random Access Memory (FeRAM), or Resistive Random Access Memory (RRAM).

At least one of the plurality of second semiconductor chips 110 may be a logic semiconductor chip, and the other second semiconductor chips 110 may be memory semiconductor chips. For example, the semiconductor chip 110a, which may be the lowermost among the plurality of second semiconductor chips 110, may be a logic semiconductor chip, and the other semiconductor chips 110b, 110c, 110d, and 110e may be memory semiconductor chips. For example, the semiconductor chip 110a, which may be the lowermost among the plurality of second semiconductor chips 110, may be a controller chip for controlling the other semiconductor chips 110b, 110c, 110d, and 110e, and the other semiconductor chips 110b, 110c, 110d, and 110e may be high bandwidth memory (HBM) DRAM semiconductor chips.

Although the five semiconductor chips 110a, 110b, 110c, 110d, and 110e are illustrated as the plurality of second semiconductor chips 110 in FIG. 1, exemplary embodiments of the present inventive concept are not limited thereto or thereby. For example, two to four second semiconductor chips or six or more second semiconductor chips may be included in the plurality of second semiconductor chips 110. When the plurality of second semiconductor chips 110 are all memory semiconductor chips, the number of second semiconductor chips 110 may be a multiple of 2. When at least one of the plurality of second semiconductor chips 110 is a logic semiconductor chip and the other second semiconductor chips 110 are memory semiconductor chips, the number of memory semiconductor chips included in the plurality of second semiconductor chips 110 may be a multiple of 2. All of the memory semiconductor chips included in the plurality of second semiconductor chips 110 may be the same type of memory semiconductor chips.

Each of the plurality of semiconductor chips 110a, 110b, 110c, 110d, and 110e, may include a plurality of penetrating electrodes 128. The plurality of penetrating electrodes 128 may be disposed in a penetrating electrode region 120. For example, several hundreds to thousands of penetrating electrodes 128 may be disposed in the penetrating electrode region 120. The plurality of penetrating electrodes 128 disposed in the penetrating electrode region 120 may be disposed in a matrix shape with a pitch of, for example, several tens of μm separating the penetrating electrodes from each other. Each of the plurality of penetrating electrodes 128 may have a diameter of, for example, several μm to several tens of μm. The diameter of each of the plurality of penetrating electrodes 128 may be less than the pitch between the penetrating electrodes 128. For example, the plurality of penetrating electrodes 128 may each have a diameter of from about 5 μm to about 15 μm and may be disposed at intervals of the pitch of from about 25 μm to about 50 μm.

The penetrating electrode region 120 may be adjacent to at least one edge of the stacked semiconductor chip structure 100a. The penetrating electrode region 120 may be adjacent to an edge or a vertex of the stacked semiconductor chip structure 100a that may be adjacent to the first semiconductor chip 130.

The plurality of semiconductor chips 110a, 110b, 110c, 110d, and 110e may be electrically connected to each other via the penetrating electrodes 128. The plurality of semiconductor chips 110a, 110b, 110c, 110d, and 110e may be electrically connected to the package base substrate 10 via the penetrating electrodes 128. The plurality of penetrating electrodes 128 may provide a signal, power, and/or a ground for the plurality of second semiconductor chips 110.

Second connection ports 116a may be connected to the penetrating electrodes 128. The second connection ports 116a may be disposed on a lower surface of each of the plurality of semiconductor chips 110a, 110b, 110c, 110d, and 110e. Dummy connection ports 116b may be disposed on the lower surface of each of the plurality of semiconductor chips 110a, 110b, 110c, 110d, and 110e. The plurality of semiconductor chips 110a, 110b, 110c, 110d, and 110e may be supported by a connection port group 116 including the second connection ports 116a and the dummy connection ports 116b. The dummy connection ports 116b may be electrically insulated from the plurality of semiconductor chips 110a, 110b, 110c, 110d, and 110e.

Each of the second connection ports 116a may have a diameter of, for example, several tens of μm. The diameter of the second connection ports 116a may be greater than the diameter of the penetrating electrodes 128 and less than the pitch between the penetrating electrodes 128. For example, each of the second connection ports 116a may have a diameter of about 20 μm.

The penetrating electrodes 128 may be disposed in through-silicon vias (TSVs). Each of the penetrating electrodes 128 may include a metal wiring layer and a metal barrier layer that surrounds the metal wiring layer. The metal wiring layer may include Cu or W. For example, the metal wiring layer may include Cu, CuSn, CuMg, CuNi, CuZn, CuPd, CuAu, CuRe, CuW, W, or a W alloy, but exemplary embodiments of the present inventive concept are not limited thereto or thereby. For example, the metal wiring layer may include one or more of Al, Au, Be, Bi, Co, Cu, Hf, In, Mn, Mo, Ni, Pb, Pd, Pt, Rh, Re, Ru, Ta, Te, Ti, W, Zn, and Zr, and may have a stacked structure in which the selected one or more materials are stacked. The metal barrier layer may include at least one selected from W, WN, WC, Ti, TiN, Ta, TaN, Ru, Co, Mn, WN, Ni, and NiB, and may be a single layer or a multi-layer. However, the materials of the penetrating electrodes 128 according to exemplary embodiments of the present invention are not limited to the aforementioned materials. The metal barrier layer and the metal wiring layer may be formed by physical vapor deposition (PVD) or chemical vapor deposition (CVD), but exemplary embodiments of the present inventive concept are not limited thereto or thereby. A spacer insulation layer may be disposed between the penetrating electrodes 128 and the semiconductor substrate which may be included in the second semiconductor chips 110. The spacer insulation layer may prevent a semiconductor device formed in each of the plurality of semiconductor chips 110a, 110b, 110c, 110d, and 110e, which are the plurality of second semiconductor chips 110, from directly contacting the penetrating electrodes 128. The spacer insulation layer may include an oxide layer, a nitride layer, a carbide layer, a polymer, or a combination thereof. In some exemplary embodiments of the present inventive concept, a CVD process may be used to form the spacer insulation layer. The spacer insulation layer may include an ozone/tetra-ethyl ortho-silicate (O3/TEOS)-based high aspect ratio process (HARP) oxide layer formed by sub-atmospheric CVD.

Although the penetrating electrodes 128 are illustrated as directly connecting the active surfaces 112 of the plurality of semiconductor chips 110a, 110b, 110c, 110d, and 110e to inactive surfaces 114 thereof, exemplary embodiments of the present inventive concept are not limited thereto or thereby. The penetrating electrodes 128 may have a via-first structure, a via-middle structure, or a via-last structure. The via-first structure, the via-middle structure, and the via-last structure and a method of manufacturing the same are described, for example, in books such as Antonis Papanikolaou, Dimitrios Soudris, & Riko Radojcic (Eds.), *Three Dimensional System Integration*, Springer (2011), Chuan Seng Tan, Kuan-Neng Chen, & Steven J. Koester (Eds.), *3D Integration for VLSI Systems*, CRC Press (2012), and Nauman Khan, & Soha Hassoun, *Designing TSVs for 3D Integrated Circuits*, Springer (2011).

A front pad and a rear pad may be electrically connected to the penetrating electrodes 128. The front pad and the rear pad may be respectively disposed on the active surface 112 and the inactive surface 114 of each of the plurality of semiconductor chips 110a, 110b, 110c, 110d, and 110e. Although the front pad and the rear pad may be disposed opposite to the penetrating electrodes 128 and may be electrically connected to the penetrating electrodes 128, exemplary embodiments of the present inventive concept are not limited thereto or thereby. The front pad and the rear pad may be disposed separately from the penetrating electrodes 128. The front pad and the rear pad may be electrically connected to the penetrating electrodes 128 via a re-wiring layer.

The package molding layer 300 may be disposed on the package base substrate 10. The package molding layer 300 may surround a lateral surface of the sub-semiconductor package 130a including the first semiconductor chip 130 and a lateral surface of the stacked semiconductor chip structure 100a. The package molding layer 300 may include an EMC, for example. The package molding layer 300 may be formed together with the first sub-package molding layer 138. The package molding layer 300 might not be disposed on an upper surface of the sub-semiconductor package 130a and an upper surface of the stacked semiconductor chip structure 100a. For example, the package molding layer 300 might not be disposed on an upper surface of the first semiconductor chip 130 included in the sub-semiconductor package 130a and an upper surface of the semiconductor chip 110e which may be the uppermost among the plurality of second semiconductor chips 110 included in the stacked semiconductor chip structure 100a.

The upper surface of the first semiconductor chip 130 and the upper surface of the semiconductor chip 110e, which may be the uppermost among the plurality of second semiconductor chips 110, may be on the same level with respect to the package base substrate 10. For example, the first semiconductor chip 130 and the semiconductor chip 110e may be disposed on the package base substrate 10 and may a have relatively large thicknesses. The package molding layer 300 may cover the first semiconductor chip 130 and the semiconductor chip 110e. An upper portion of the package molding layer 300 may be partially removed after being formed until both the upper surface of the first semiconductor chip 130 and the upper surface of the semiconductor chip 110e are exposed. Thus, the upper surface of the first semiconductor chip 130 and the upper surface of the semiconductor chip 110e may be on the same level as each other with respect to the package base substrate 10. The upper surface of the first semiconductor chip 130, the upper surface of the semiconductor chip 110e and an upper surface of the package molding layer 300 may be on the same level as each other with respect to the package base substrate 10.

A thermal interface material (TIM) layer 400 may be disposed on the sub-semiconductor package 130a including the first semiconductor chip 130 and on the stacked semiconductor chip structure 100a. The TIM layer 400 may cover the upper surface of the first semiconductor chip 130, the upper surface of the semiconductor chip 110e and the upper surface of the package molding layer 300. The TIM layer 400 may include an insulation material or an electrical insulation material. The TIM layer 400 may include epoxy resin, for example. The TIM layer 400 may be, for example, a mineral oil layer, a grease layer, a gap filler putty layer, a phase change gel layer, a phase change material pad layer, or a particle filled epoxy layer.

A heat dissipation member 500 may be disposed on the first semiconductor chip 130 and the stacked semiconductor chip structure 100a. The TIM layer 400 may be disposed between the first semiconductor chip 130 and the stacked semiconductor chip structure 100a. The heat dissipation member 500 may be, for example, a heat sink, a heat spreader, a heat pipe, or a liquid cooled cold plate.

In the semiconductor package 1a, the sub-semiconductor package 130a including the first semiconductor chip 130 and the stacked semiconductor chip structure 100a including the plurality of second semiconductor chips 110 may be disposed adjacent to each other on the package base substrate 10. The TIM layer 400 and the heat dissipation member 500 may be disposed on the sub-semiconductor package 130a and the stacked semiconductor chip structure 100a.

The plurality of penetrating electrodes 128 disposed on the semiconductor chip 100e may be in contact with the TIM layer 400. When the heat dissipation member 500 is conductive, the plurality of penetrating electrodes 128 may be electrically insulated from the heat dissipation member 500 by the TIM layer 400.

The penetrating electrode region 120 may be adjacent to a vertex or at least one edge of the stacked semiconductor chip structure 100a, which may be adjacent to the first semiconductor chip 130. For example, the penetrating electrode region 120 may be adjacent to a vertex or at least one edge of the stacked semiconductor chip structure 100a that is opposite to one edge of the first semiconductor chip 130.

The sub-semiconductor package 130a may provide larger heating power (W/cm$^2$) per unit area than the stacked semiconductor chip structure 100a. The first semiconductor chip 130 may provide larger heating power per unit area than the plurality of second semiconductor chips 110. When the first semiconductor chip 130 is, for example, an MPU or a GPU, and the plurality of second semiconductor chips 110 include a memory semiconductor chip, the first semiconductor chip 130 may consume a relatively large amount of power and may generate a relatively large amount of heat compared with the plurality of second semiconductor chips 110. Accordingly, within the semiconductor package 1a, generated heat may be relatively concentrated in the first semiconductor chip 130.

A portion of the heat generated by the first semiconductor chip 130 may be discharged from the inactive surface 134 of the first semiconductor chip 130 to the outside of the semiconductor package 1a via the TIM layer 400 and the heat dissipation member 500. Since the heat emitted via the lateral surface of the first semiconductor chip 130 might not be easily discharged to the outside of the semiconductor package 1a because of a relatively long discharge path, partial heat concentration may occur within the semiconductor package 1a. However, when the penetrating electrode region 120 of the stacked semiconductor chip structure 100a is adjacent to the first semiconductor chip 130, the heat emitted via the lateral surface of the first semiconductor chip 130 may be discharged to the outside of the semiconductor package 1a relatively quickly via the penetrating electrodes 128 of the penetrating electrode region 120, the TIM layer 400, and the heat dissipation member 500. Thus, partial heat concentration may be reduced or prevented within the semiconductor package 1a, and accordingly operational reliability of the semiconductor package 1a may be increased.

Although only one sub-semiconductor package 130a and only one stacked semiconductor chip structure 100a are illustrated in FIG. 1, exemplary embodiments of the present inventive concept are not limited thereto or thereby. For example, the semiconductor package 1a may include a plurality of sub-semiconductor packages 130a and/or a plurality of stacked semiconductor chip structures 100a.

Although the penetrating electrode region 120 is illustrated as being disposed on only one side of the stacked semiconductor chip structure 100a, exemplary embodiments of the present inventive concept are not limited thereto or thereby. For example, when two first semiconductor chips 130 are respectively disposed adjacent to two sides of the stacked semiconductor chip structure 100a, two penetrating electrode regions 120 may be respectively disposed on two sides of the stacked semiconductor chip structure 100a adjacent to the two first semiconductor chips 130. This will be described in more detail below with reference to FIGS. 5-16.

Although a cross-section of the sub-semiconductor package 130a and a cross-section of the stacked semiconductor chip structure 100a may be taken along a same direction, the respective cross-sections of the sub-semiconductor package 130a and the stacked semiconductor chip structure 100a may be taken in different directions according to an arrangement of the sub-semiconductor package 130a and the stacked semiconductor chip structure 100a.

Figure 2:
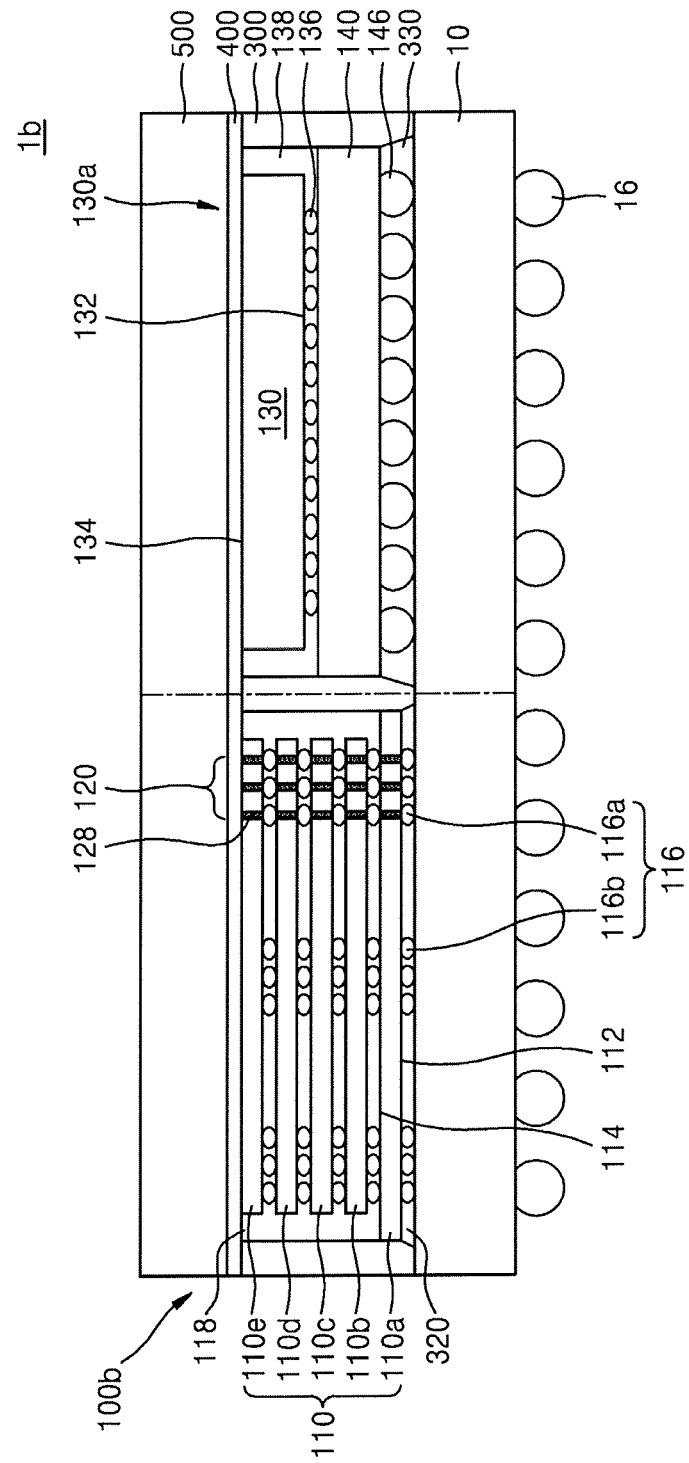
FIG. 2 is a cross-sectional view of a semiconductor package according to an exemplary embodiment of the present inventive concept.

FIG. 2 is a cross-sectional view of a semiconductor package according to an exemplary embodiment of the present inventive concept. A repeated description of components described above with reference to FIG. 1 may be omitted.

Referring to FIG. 2, a semiconductor package 1b may include the package base substrate 10, the sub-semiconductor package 130a, and the stacked semiconductor chip structure 100b. The sub-semiconductor package 130a and the stacked semiconductor chip structure 100a may be disposed on the package base substrate 10 adjacent to each other.

The stacked semiconductor chip structure 100b may include the plurality of second semiconductor chips 110. The plurality of second semiconductor chips 110 may be sequentially stacked. The plurality of second semiconductor chips 110 may include semiconductor chips 110a, 110b, 110c, 110d, and 110e which may be stacked in a vertical direction.

At least one of the plurality of second semiconductor chips 110 may be a logic semiconductor chip, and the second semiconductor memory chips 110 may be memory semiconductor chips. For example, the plurality of second semiconductor chips 110 may include the logic semiconductor chip and a plurality of memory semiconductor chips stacked on the logic semiconductor chip. For example, the semiconductor chip 110a, which may be the lowermost from among the plurality of second semiconductor chips 110, may be a logic semiconductor chip, and the other semiconductor chips 110b, 110c, 110d, and 110e may be memory semiconductor chips. For example, the semiconductor chip 110a may be a controller chip for controlling the other semiconductor chips 110b, 110c, 110d, and 110e, and the other semiconductor chips 110b, 110c, 110d, and 110e may be HBM DRAM semiconductor chips.

An area of the logic semiconductor chip among the plurality of second semiconductor chips 110 may be greater than that of each of the memory semiconductor chips. For example, an area of the semiconductor chip 110a may be greater than an area of each of the other semiconductor chips 110b, 110c, 110d, and 110e.

A stacked semiconductor chip structure 100b may include a second sub-package molding layer 118. The sub-package molding layer 118 may be disposed on the logic semiconductor chip and may cover lateral surfaces of the memory semiconductor chips but not an upper surface of an uppermost memory semiconductor chip among the memory semiconductor chips. For example, the stacked semiconductor chip structure 100b may include a second sub-package molding layer 118, which may be disposed on the semiconductor chip 110a and may cover lateral surfaces of the other semiconductor chips 110b, 110c, 110d, and 110e but not an upper surface of the uppermost semiconductor chip 110e. The second sub-package molding layer 118 may include EMC, for example. The second sub-package molding layer 118 may be formed together with a package molding layer 300 which will be described in more detail below.

A second underfill material layer 320 may fill a space between the stacked semiconductor chip structure 100b and the package base substrate 10. The second underfill material layer 320 may include an epoxy resin, for example. The second underfill material layer 320 may be a portion of the package molding layer 300, which may include, for example, MUF.

The semiconductor packages 1a and 1b illustrated in FIGS. 1 and 2 may be substantially the same as each other except that the structure of the stacked semiconductor chip structure 100a of FIG. 1 may be different from that of the stacked semiconductor chip structure 100b of FIG. 2 as described above, and thus repetitious descriptions may be omitted.

Figure 3:
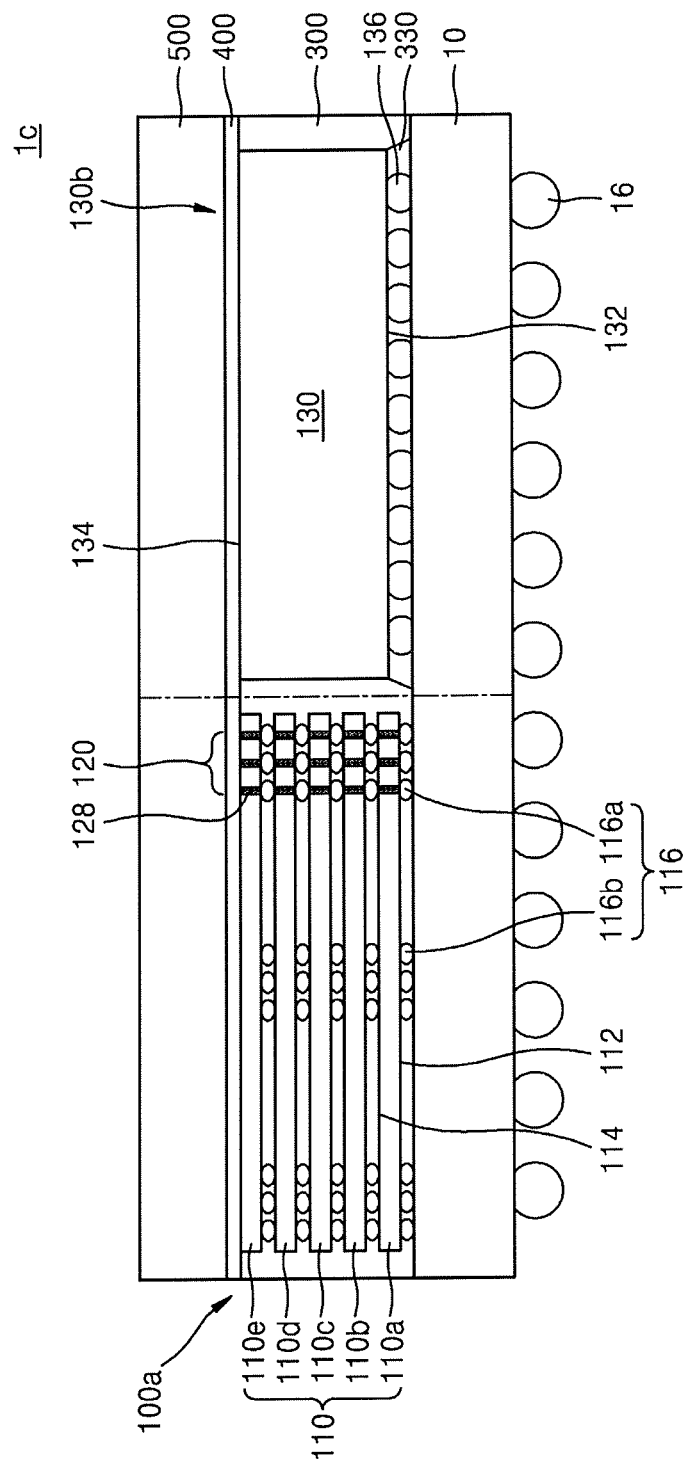
FIG. 3 is a cross-sectional view of a semiconductor package according to an exemplary embodiment of the present inventive concept.

FIG. 3 is a cross-sectional view of a semiconductor package according to an exemplary embodiment of the present inventive concept. A repeated description of components described above with reference to FIG. 1 may be omitted.

Referring to FIG. 3, a semiconductor package 1c may include the package base substrate 10, a sub-semiconductor package 130b, and the stacked semiconductor chip structure 100a. The sub-semiconductor package 130b and the stacked semiconductor chip structure 100a may be disposed on the package base substrate 10 adjacent to each other.

The sub-semiconductor package 130b may include the first semiconductor chip 130. The first semiconductor chip 130 may be disposed on the package base substrate 10. An active surface 132 of the first semiconductor chip 130 may face the package base substrate 10. The first semiconductor chip 130 may be connected to the package base substrate 10. For example, the first semiconductor chip 130 may be electrically connected to the package base substrate 10 via first connection ports 136 disposed on the active surface 132. The first connection ports 136 may be, for example, bumps or solder balls. The first underfill material layer 330 may fill a space between the sub-semiconductor chip 130b and the package base substrate 10. The first underfill material layer 330 may include epoxy resin, for example. The first underfill material layer 330 may be a portion of the package molding layer 300, which may include, for example, MUF. The sub-semiconductor package 130b may be, for example, a wafer level package (WLP).

The semiconductor packages 1a and 1c of FIGS. 1 and 3 may be substantially the same as each other except that the structure of the sub-semiconductor package 130a of FIG. 1 may be different from that of the sub-semiconductor package 130b of FIG. 3 as described above, and thus repetitious descriptions may be omitted.

Figure 4:
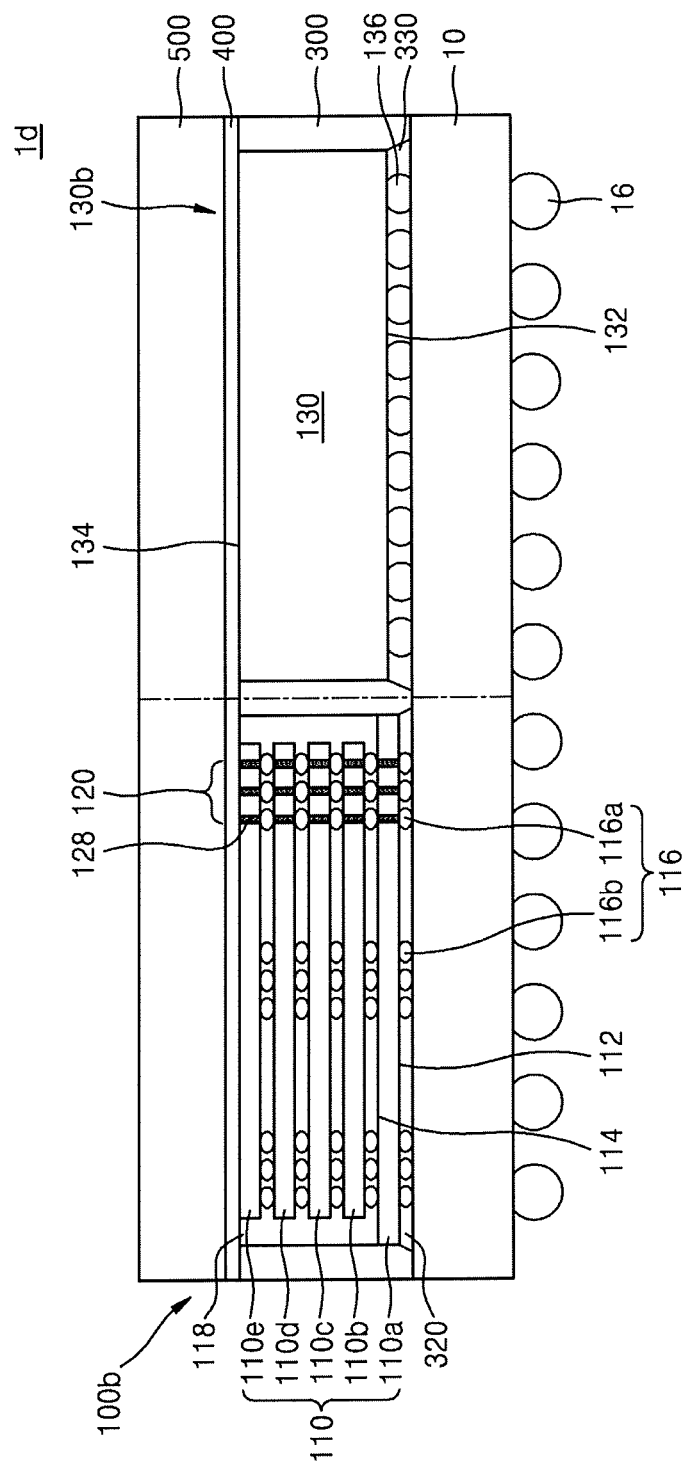
FIG. 4 is a cross-sectional view of a semiconductor package according to an exemplary embodiment of the present inventive concept.

FIG. 4 is a cross-sectional view of a semiconductor package according to an exemplary embodiment of the present inventive concept. A repeated description of components described above with reference to FIGS. 1-3 may be omitted.

Referring to FIG. 4, a semiconductor package 1d may include a package base substrate 10 the sub-semiconductor package 130b, and the stacked semiconductor chip structure 100b. The sub-semiconductor package 130b and the stacked semiconductor chip structure 100b may be disposed on the package base substrate 10 adjacent to each other.

The stacked semiconductor chip structure 100b of FIG. 4 may have the same structure as that of the stacked semiconductor chip structure 100b of FIG. 2. The sub-semiconductor package 130b of FIG. 4 may have the same structure as that of the sub-semiconductor package 130b of FIG. 3.

The semiconductor package 1d of FIG. 4 may be substantially the same as the semiconductor packages 1a, 1b, and 1c of FIGS. 1-3 except for the above-described differences, and thus repetitious descriptions may be omitted.

FIGS. 5-16 are planar views illustrating arrangements of semiconductor chips included in semiconductor packages according to exemplary embodiments of the present inventive concept. The first semiconductor chips 130 and the plurality of second semiconductor chips 110 included in the semiconductor packages 1a, 1b, 1c, and 1d of FIGS. 1-4 may be included in sub-semiconductor packages and stacked semiconductor chip structures included in the semiconductor packages of FIGS. 5-16.

Since the plurality of second semiconductor chips 110a, 110b, 110c, 110d, and 110e illustrated in FIGS. 1-4 may be vertically stacked to form the single stacked semiconductor chip structures 100a or 100b, a plurality of second semiconductor chips may also be referred to as stacked semiconductor chip structures with reference to FIGS. 5-16.

Figure 5:
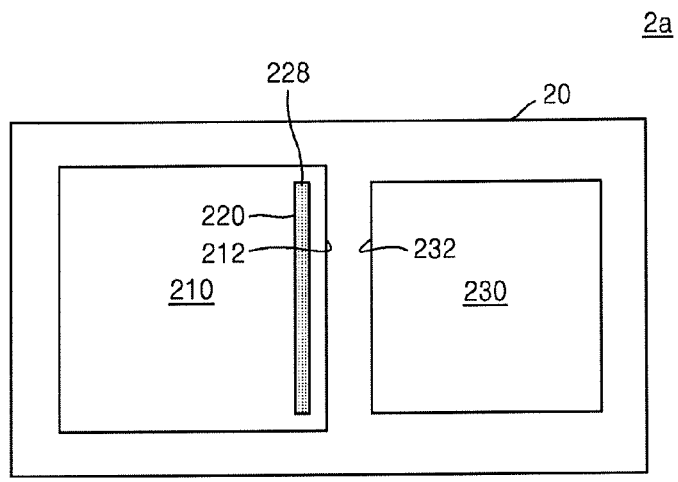
FIG. 5 is a planar view illustrating an arrangement of semiconductor chips included in a semiconductor package according to an exemplary embodiment of the present inventive concept.

FIG. 5 is a planar view illustrating an arrangement of semiconductor chips included in a semiconductor package according to an exemplary embodiment of the present inventive concept.

Referring to FIG. 5, a semiconductor package 2a may include a first semiconductor chip 230 and a stacked semiconductor chip structure 210 which may be disposed on a package base substrate 20. The first semiconductor chip 230 and the stacked semiconductor chip structure 210 may be disposed adjacent to each other.

An edge 212 of the stacked semiconductor chip structure 210 may face an edge 232 of the first semiconductor chip 230. A plurality of penetrating electrodes 228 may be disposed in a penetrating electrode region 220. The penetrating electrode region 220 may adjacent to the edge 212 of the stacked semiconductor chip structure 210 that is opposite to the edge 232 of the first semiconductor chip 230. The penetrating electrode region 220 may extend along the edge 212 of the stacked semiconductor chip structure 210 that may be opposite to the edge 232 of the first semiconductor chip 230.

Several hundreds to thousands of the penetrating electrodes 228 may be disposed in the penetrating electrode region 220. The penetrating electrode region 220 may be a region in which the plurality of penetrating electrodes 228 is disposed at relatively regular intervals. For example, the plurality of penetrating electrodes 228 may be disposed at intervals of a pitch of several tens of μm within the penetrating electrode region 220. For example, the plurality of penetrating electrodes 228 may be separated by a pitch of from about 25 μm to about 50 μm within the penetrating electrode region 220.

When a memory semiconductor chip is included in the stacked semiconductor chip structure 210, memory cells included in the memory semiconductor chip may be disposed in an area other than the penetrating electrode region 220. A memory cell block on which the memory cells included in the memory semiconductor chip are disposed may be disposed on a side of the penetrating electrode region 220 that is opposite to the first semiconductor chip 230. When a connection pad for the memory cell block is a center pad disposed at the center of the memory semiconductor chip, a re-wiring pattern (not shown) for connecting the connection pad to the penetrating electrodes 228 may be disposed in the memory semiconductor chip. Alternatively, an internal wiring may be included in the memory semiconductor chip and the connection pad for the memory cell block may be disposed on the penetrating electrode region 220.

When the first semiconductor chip 230 generates a larger amount of heat per unit area than the stacked semiconductor chip structure 210, heat transmitted toward the stacked semiconductor chip structure 210 from the heat generated by the first semiconductor chip 230 may be discharged to the outside of the semiconductor package 2a via the penetrating electrodes 228. Accordingly, a concentration of heat may be reduced or prevented from occurring between the first semiconductor chip 230 and the stacked semiconductor chip structure 210. The heat generated by the first semiconductor chip 230 may be prevented from affecting an operation of a semiconductor device, for example, memory cells, included in the stacked semiconductor chip structure 210. Thus, operational reliability of the semiconductor package 2a may be increased.

Figure 6:
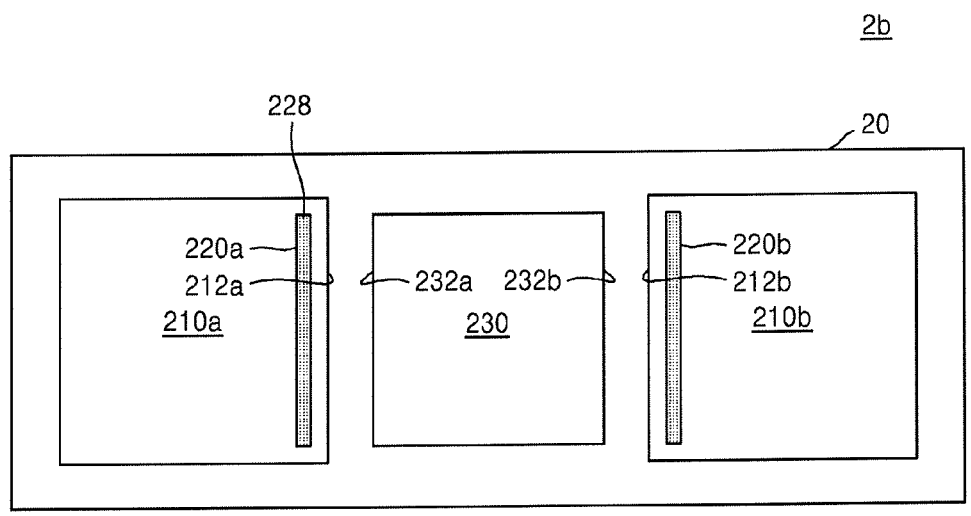
FIG. 6 is a planar view illustrating an arrangement of semiconductor chips included in a semiconductor package according to an exemplary embodiment of the present inventive concept.

FIG. 6 is a planar view illustrating an arrangement of semiconductor chips included in a semiconductor package according to an exemplary embodiment of the present inventive concept. A repeated description of the above-described components may be omitted.

Referring to FIG. 6, a semiconductor package 2b may include the first semiconductor chip 230 disposed on the package base substrate 20, and first and second stacked semiconductor chip structures 210a and 210b disposed on the package base substrate 20 adjacent to the first semiconductor chip 230. The first stacked semiconductor chip structure 210a and the second stacked semiconductor chip structure 210b may be respectively disposed adjacent to a first edge 232a and a second edge 232b of the first semiconductor chip 230.

The first edge 232a of the first semiconductor chip 230 may face an edge 212a of the first stacked semiconductor chip structure 210a. The second edge 232b of the first semiconductor chip 230 may face an edge 212b of the second stacked semiconductor chip structure 210b.

The first and second stacked semiconductor chip structures 210a and 210b may include penetrating electrode regions 220a and 220b, respectively. The plurality of penetrating electrodes 228 may be disposed in each of the penetrating electrode regions 220a and 220b. The penetrating electrode region 220a of the first stacked semiconductor chip structure 210a may be disposed adjacent to the edge 212a of the first stacked semiconductor chip structure 210a that is opposite to the first edge 232a of the first semiconductor chip 230. The penetrating electrode region 220a of the first stacked semiconductor chip structure 210a may extend along the edge 212a of the first stacked semiconductor chip structure 210a that is opposite to the first edge 232a of the first semiconductor chip 230. The penetrating electrode region 220b of the second stacked semiconductor chip structure 210b may be disposed adjacent to the edge 212b of the second stacked semiconductor chip structure 210b that is opposite to the second edge 232b of the first semiconductor chip 230. The penetrating electrode region 220b of the second stacked semiconductor chip structure 210b may extend along the edge 212b of the second stacked semiconductor chip structure 210b that is opposite to the second edge 232b of the first semiconductor chip 230.

When the first semiconductor chip 230 generates a larger amount of heat per unit area than each of the first and second stacked semiconductor chip structures 210a and 210b, heat transmitted toward the first and second stacked semiconductor chip structures 210a and 210b from the heat generated by the first semiconductor chip 230 may be discharged to the outside of the semiconductor package 2b via the penetrating electrodes 228. Accordingly, a concentration of heat may be reduced or prevented from occurring between the first semiconductor chip 230 and each of the first and second stacked semiconductor chip structures 210a and 210b. The heat generated by the first semiconductor chip 230 may be prevented from affecting an operation of a semiconductor device, for example, memory cells, included in each of the first and second stacked semiconductor chip structure 210a and 210b. Thus, operational reliability of the semiconductor package 2b may be increased.

Figure 7:
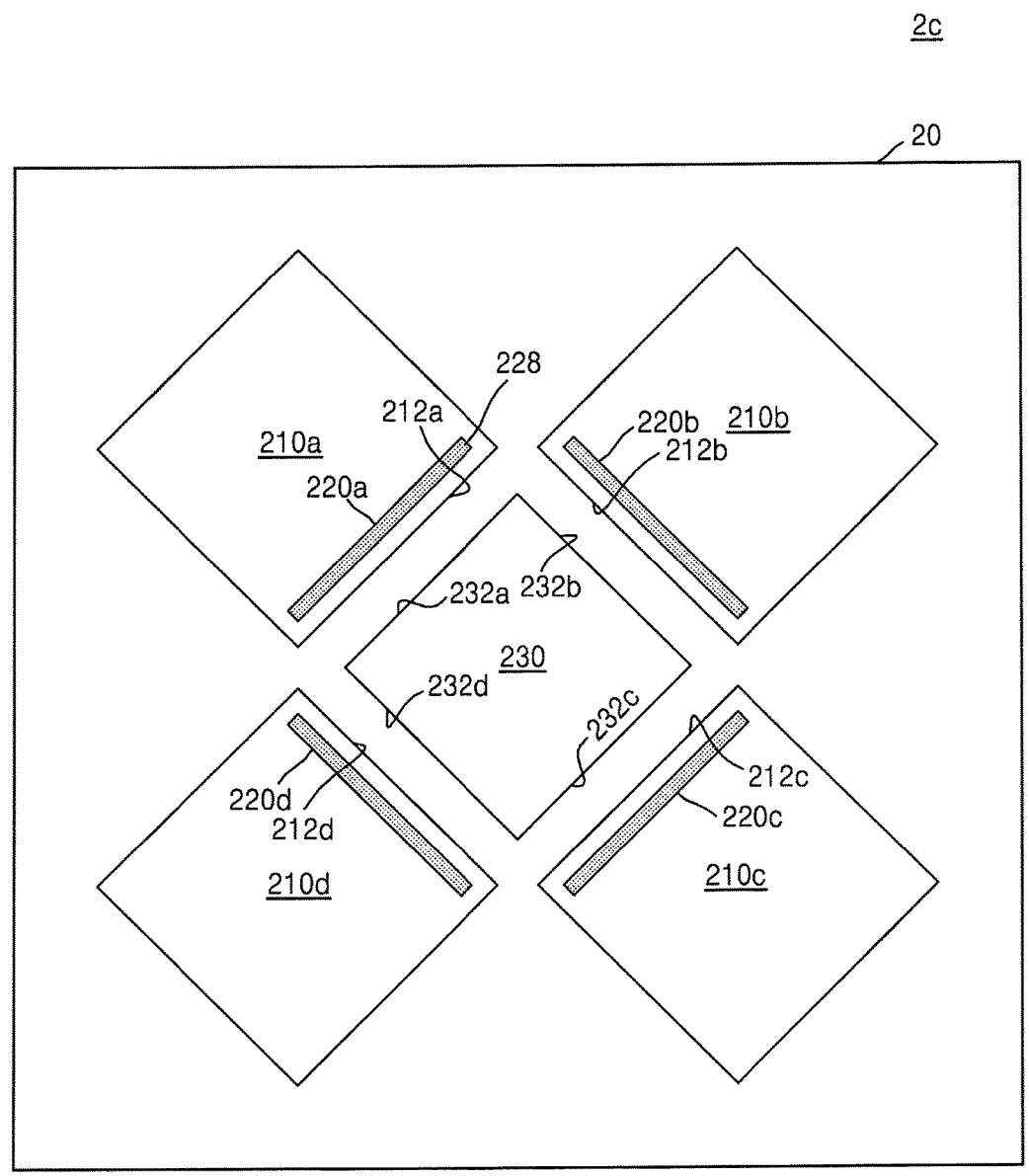
FIG. 7 is a planar view illustrating an arrangement of semiconductor chips included in a semiconductor package according to an exemplary embodiment of the present inventive concept.

FIG. 7 is a planar view illustrating an arrangement of semiconductor chips included in a semiconductor package according to an exemplary embodiment of the present inventive concept. A repeated description of the above-described components may be omitted.

Referring to FIG. 7, a semiconductor package 2c includes the first semiconductor chip 230 disposed on the package base substrate 20, and first, second, third, and fourth stacked semiconductor chip structures 210a, 210b, 210c, and 210d disposed on the package base substrate 20 adjacent to the first semiconductor chip 230. The first, second, third, and fourth stacked semiconductor chip structures 210a, 210b, 210c, and 210d may be respectively disposed adjacent to first, second, third, and fourth edges 232a, 232b, 232c, and 232d of the first semiconductor chip 230.

The first edge 232a of the first semiconductor chip 230 may face an edge 212a of the first stacked semiconductor chip structure 210a. The second edge 232b of the first semiconductor chip 230 may face an edge 212b of the second stacked semiconductor chip structure 210b. The third edge 232c of the first semiconductor chip 230 may face an edge 212c of the third stacked semiconductor chip structure 210c. The fourth edge 232d of the first semiconductor chip 230 may face an edge 212d of the fourth stacked semiconductor chip structure 210d.

The first, second, third, and fourth stacked semiconductor chip structures 210a, 210b, 210c, and 210d may include penetrating electrode regions 220a, 220b, 220c, and 220d, respectively. The plurality of penetrating electrodes 228 may be disposed in each of the first, second, third, and fourth stacked semiconductor chip structures 210a, 210b, 210c, and 210d. The penetrating electrode region 220a of the first stacked semiconductor chip structure 210a may be disposed adjacent to the edge 212a of the first stacked semiconductor chip structure 210a that is opposite to the first edge 232a of the first semiconductor chip 230. The penetrating electrode region 220a of the first stacked semiconductor chip structure 210a may extend along the edge 212a of the first stacked semiconductor chip structure 210a that is opposite to the first edge 232a of the first semiconductor chip 230. The penetrating electrode region 220b of the second stacked semiconductor chip structure 210b may be disposed adjacent to the edge 212b of the second stacked semiconductor chip structure 210b that is opposite to the second edge 232b of the first semiconductor chip 230. The penetrating electrode region 220b of the second stacked semiconductor chip structure 210b may extend along the edge 212b of the second stacked semiconductor chip structure 210b that is opposite to the second edge 232b of the first semiconductor chip 230.

The penetrating electrode region 220c of the third stacked semiconductor chip structure 210c may be disposed adjacent to the edge 212c of the third stacked semiconductor chip structure 210c that is opposite to the third edge 232c of the first semiconductor chip 230. The penetrating electrode region 220c of the third stacked semiconductor chip structure 210c may extend along the edge 212c of the third stacked semiconductor chip structure 210c that is opposite to the third edge 232c of the first semiconductor chip 230. The penetrating electrode region 220d of the fourth stacked semiconductor chip structure 210d may be disposed adjacent to the edge 212d of the fourth stacked semiconductor chip structure 210d that is opposite to the fourth edge 232d of the first semiconductor chip 230. The penetrating electrode region 220d of the fourth stacked semiconductor chip structure 210d may extend along the edge 212d of the fourth stacked semiconductor chip structure 210d that is opposite to the fourth edge 232d of the first semiconductor chip 230.

When the first semiconductor chip 230 generates a larger amount of heat per unit area than each of the first, second, third, and fourth stacked semiconductor chip structures 210a, 210b, 210c, and 210d, heat transmitted toward the first, second, third, and fourth stacked semiconductor chip structures 210a, 210b, 210c, and 210d from the heat generated by the first semiconductor chip 230 may be discharged to the outside of the semiconductor package 2c via the penetrating electrodes 228. Accordingly, a concentration of heat may be reduced or prevented from occurring between the first semiconductor chip 230 and each of the first, second, third, and fourth stacked semiconductor chip structures 210a, 210b, 210c, and 210d. The heat generated by the first semiconductor chip 230 may be prevented from affecting an operation of a semiconductor device, for example, memory cells, included in each of the first, second, third, and fourth stacked semiconductor chip structure 210a, 210b, 210c, and 210d. Thus, operational reliability of the semiconductor package 2c may be increased.

Figure 8:
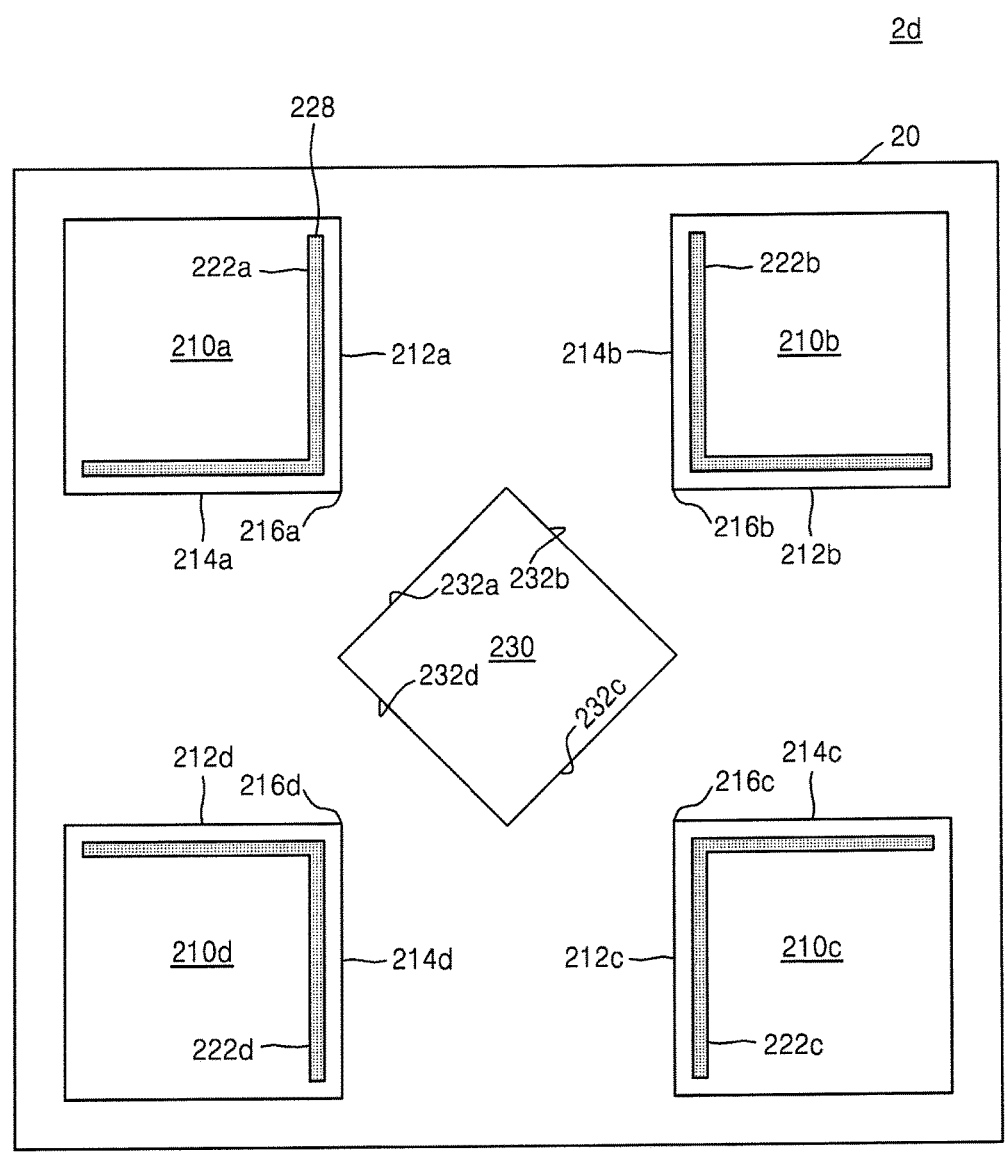
FIG. 8 is a planar view illustrating an arrangement of semiconductor chips included in a semiconductor package according to an exemplary embodiment of the present inventive concept.

FIG. 8 is a planar view illustrating an arrangement of semiconductor chips included in a semiconductor package according to an exemplary embodiment of the present inventive concept. A repeated description of the above-described components may be omitted.

Referring to FIG. 8, a semiconductor package 2d may include the first semiconductor chip 230 disposed on the package base substrate 20, and first, second, third, and fourth stacked semiconductor chip structures 210a, 210b, 210c, and 210d disposed on the package base substrate 20 adjacent to the first semiconductor chip 230. The first, second, third, and fourth stacked semiconductor chip structures 210a, 210b, 210c, and 210d may be respectively disposed adjacent to first, second, third, and fourth edges 232a, 232b, 232c, and 232d of the first semiconductor chip 230.

The first edge 232a of the first semiconductor chip 230 may face a vertex 216a of the first stacked semiconductor chip structure 210a. The second edge 232b of the first semiconductor chip 230 may face a vertex 216b of the second stacked semiconductor chip structure 210b. The third edge 232c of the first semiconductor chip 230 may face a vertex 216c of the third stacked semiconductor chip structure 210c. The fourth edge 232d of the first semiconductor chip 230 may face a vertex 216d of the fourth stacked semiconductor chip structure 210d. In other words, the first through fourth stacked semiconductor chip structures 210a, 210b, 210c, and 210d may be disposed such that the vertexes 216a, 216b, 216c, and 216d thereof respectively face the first through fourth edges 232a, 232b, 232c, and 232d of the first semiconductor chip 230.

The first, second, third, and fourth stacked semiconductor chip structures 210a, 210b, 210c, and 210d may include penetrating electrode regions 222a, 222b, 222c, and 222d, respectively. The plurality of penetrating electrodes 228 may be disposed in each of the penetrating electrode regions 222a, 222b, 222c, and 222d. The penetrating electrode region 222a of the first stacked semiconductor chip structure 210a may be disposed adjacent to two edges 212a and 214a that meet at the vertex 216a of the first stacked semiconductor chip structure 210a that is opposite to the first edge 232a of the first semiconductor chip 230. The penetrating electrode region 222a of the first stacked semiconductor chip structure 210a may extend along the two edges 212a and 214a of the first stacked semiconductor chip structure 210a that meet at the vertex 216a that is opposite to the first edge 232a of the first semiconductor chip 230. The penetrating electrode region 222a of the first stacked semiconductor chip structure 210a may have an L shape. The penetrating electrode region 222b of the second stacked semiconductor chip structure 210b may be disposed adjacent to two edges 212b and 214b of the second stacked semiconductor chip structure 210b that meet at the vertex 216b that is opposite to the second edge 232b of the first semiconductor chip 230. The penetrating electrode region 222b of the second stacked semiconductor chip structure 210b may extend along the two edges 212b and 214b of the second stacked semiconductor chip structure 210b that meet at the vertex 216b that is opposite to the second edge 232b of the first semiconductor chip 230. The penetrating electrode region 222b of the second stacked semiconductor chip structure 210b may have an L shape.

The penetrating electrode region 222c of the third stacked semiconductor chip structure 210c may be disposed adjacent to two edges 212c and 214c of the third stacked semiconductor chip structure 210c that meet at the vertex 216c that is opposite to the third edge 232c of the first semiconductor chip 230. The penetrating electrode region 222c of the third stacked semiconductor chip structure 210c may extend along the two edges 212c and 214c of the third stacked semiconductor chip structure 210c that meet at the vertex 216c that is opposite to the third edge 232c of the first semiconductor chip 230. The penetrating electrode region 222d of the fourth stacked semiconductor chip structure 210d may be disposed adjacent to two edges 212d and 214d of the fourth stacked semiconductor chip structure 210d that meet at the vertex 216d that is opposite to the fourth edge 232d of the first semiconductor chip 230. The penetrating electrode region 222d of the fourth stacked semiconductor chip structure 210d may extend along the two edges 212d and 214d of the fourth stacked semiconductor chip structure 210d that meet at the vertex 216d that is opposite to the fourth edge 232d of the first semiconductor chip 230. The penetrating electrode region 222d of the fourth stacked semiconductor chip structure 210d may have an L shape.

When the first semiconductor chip 230 generates a larger amount of heat per unit area than each of the first, second, third, and fourth stacked semiconductor chip structures 210a, 210b, 210c, and 210d, heat transmitted toward the first, second, third, and fourth stacked semiconductor chip structures 210a, 210b, 210c, and 210d from the heat generated by the first semiconductor chip 230 may be discharged to the outside of the semiconductor package 2c via the penetrating electrodes 228. Accordingly, a concentration of heat may be reduced or prevented from occurring between the first semiconductor chip 230 and each of the first, second, third, and fourth stacked semiconductor chip structures 210a, 210b, 210c, and 210d. The heat generated by the first semiconductor chip 230 may be prevented from affecting an operation of a semiconductor device, for example, memory cells, included in each of the first, second, third, and fourth stacked semiconductor chip structure 210a, 210b, 210c, and 210d. Thus, operational reliability of the semiconductor package 2d may be increased.

Figure 9:
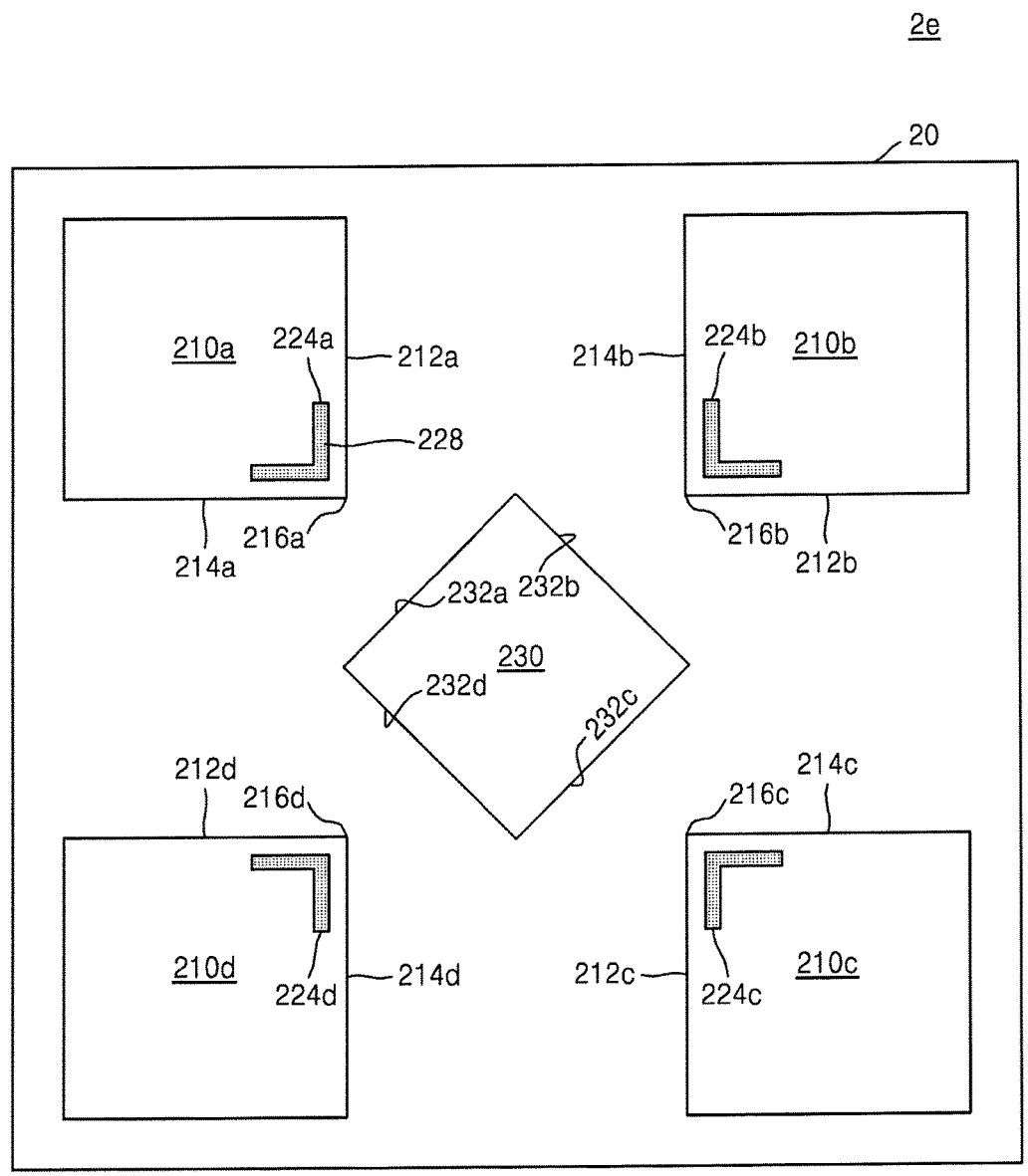
FIG. 9 is a planar view illustrating an arrangement of semiconductor chips included in a semiconductor package according to an exemplary embodiment of the present inventive concept.

FIG. 9 is a planar view illustrating an arrangement of semiconductor chips included in a semiconductor package according to an exemplary embodiment of the present inventive concept. A repeated description of components described above with reference to FIG. 8 may be omitted.

Referring to FIG. 9, a semiconductor package 2e may include the first semiconductor chip 230 disposed on the package base substrate 20, and first, second, third, and fourth stacked semiconductor chip structures 210a, 210b, 210c, and 210d may be disposed on the package base substrate 20 adjacent to the first semiconductor chip 230. The first, second, third, and fourth stacked semiconductor chip structures 210a, 210b, 210c, and 210d may be respectively disposed adjacent to first, second, third, and fourth edges 232a, 232b, 232c, and 232d of the first semiconductor chip 230. The first, second, third, and fourth stacked semiconductor chip structures 210a, 210b, 210c, and 210d may include penetrating electrode regions 224a, 224b, 224c, and 224d, respectively. The plurality of penetrating electrodes 228 may be disposed in each of the electrode regions 224a, 224b, 224c, and 224d.

The semiconductor packages 2e and 2d of FIGS. 9 and 8 may be substantially the same as each other except that the penetrating electrode regions 224a, 224b, 224c, and 224d of the semiconductor package 2e of FIG. 9 may have different sizes than the penetrating electrode regions 222a, 222b, 222c, and 222d of the semiconductor package 2d of FIG. 8, and thus repetitious descriptions may be omitted.

The penetrating electrode regions 224a, 224b, 224c, and 224d of the semiconductor package 2e of FIG. 9 may extend less along the two edges 212a and 214a, the two edges 212b and 214b, the two edges 212c and 214c, and the two edges 212d and 214d, respectively meeting at the vertexes 216a, 216b, 216c, and 216d of the first through fourth stacked semiconductor chip structures 210a, 210b, 210c, and 210d, than the penetrating electrode regions 222a, 222b, 222c, and 222d of the semiconductor package 2d of FIG. 8. The penetrating electrode regions 224a, 224b, 224c, and 224d of the semiconductor package 2e of FIG. 9 may each have a relatively small L shape.

Referring to FIG. 9 and FIGS. 1-4, when at least one of the second semiconductor chips 110a, 110b, 110c, 110d, and 110e included in the first through fourth stacked semiconductor chip structures 210a, 210b, 210c, and 210d is a logic semiconductor chip, the semiconductor package 2e may include a connection port disposed between the package base substrate 20 and each of the first through fourth stacked semiconductor chip structures 210a, 210b, 210c, and 210d. The connection port may electrically connect the logic semiconductor chip to the first semiconductor chip 230. For example, when the lowermost semiconductor chip 110a from among the second semiconductor chips 110a, 110b, 110c, 110d, and 110e included in the first through fourth stacked semiconductor chip structures 210a, 210b, 210c, and 210d is a logic semiconductor chip, the semiconductor package 2e may include the connection port, which may be disposed between the lowermost semiconductor chip 110a and the package base substrate 10 or 20. The connection port may electrically connect the lowermost semiconductor chip 110a to the first semiconductor chip 230. The connection port may be in addition to the second connection ports 116a, which may be electrically connected to the penetrating electrodes 128 to electrically connect the second semiconductor chips 110a, 110b, 110c, 110d, and 110e to the package base substrate 10 or 20. The connection port may be disposed in a portion where each of the penetrating electrode regions 224a, 224b, 224c, and 224d is not disposed, such as a portion of each of the first through fourth stacked semiconductor chip structures 210a, 210b, 210c, and 210d that is adjacent to each pair of the two edges 212a and 214a, the two edges 212b and 214b, the two edges 212c and 214c, and the two edges 212d and 214d of the first through fourth stacked semiconductor chip structures 210a, 210b, 210c, and 210d, which respectively meet at the vertexes 216a, 216b, 216c, and 216d.

Figure 10:
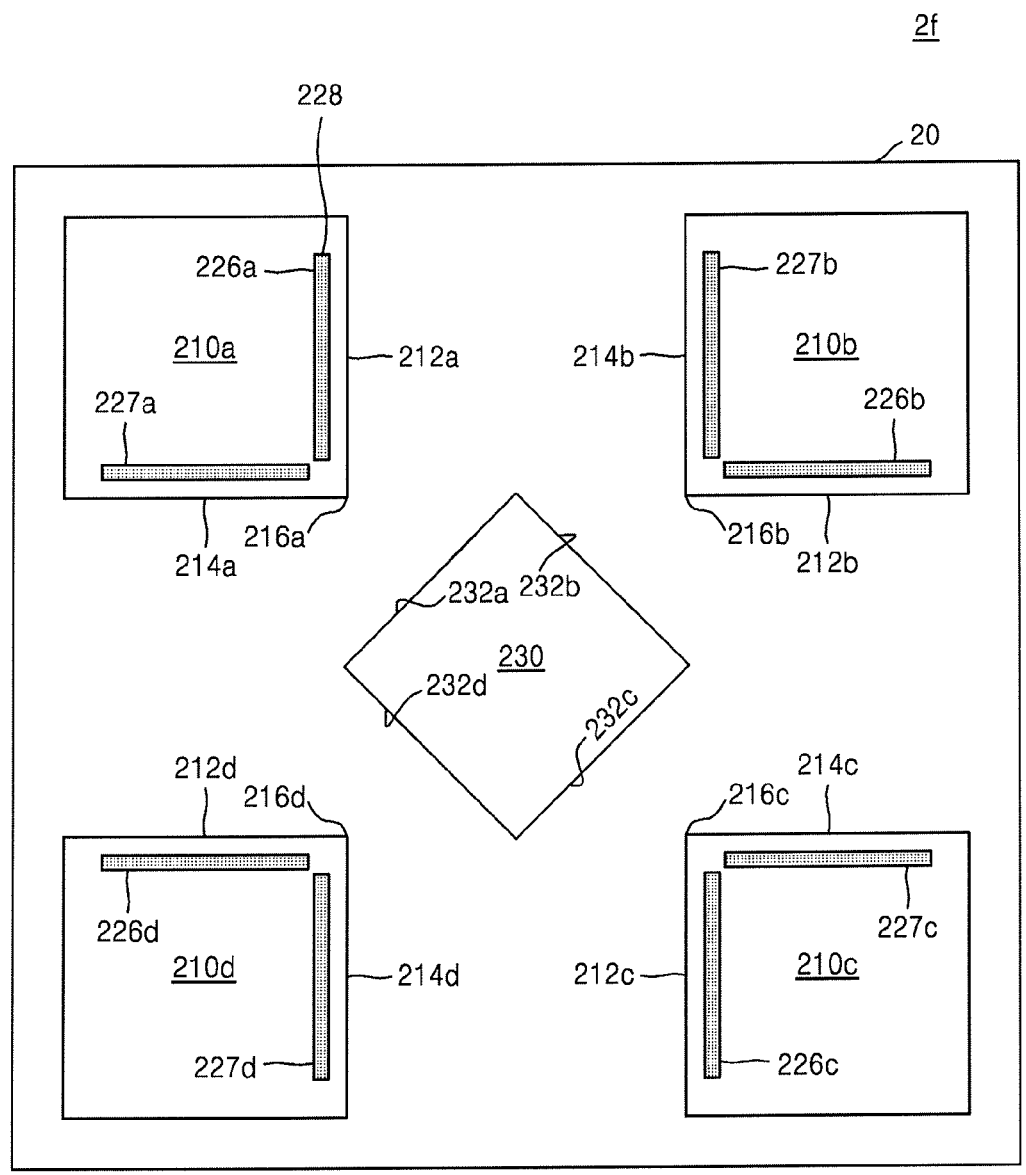
FIG. 10 is a planar view illustrating an arrangement of semiconductor chips included in a semiconductor package according to an exemplary embodiment of the present inventive concept.

FIG. 10 is a planar view illustrating an arrangement of semiconductor chips included in a semiconductor package according to an exemplary embodiment of the present inventive concept. A repeated description of components described above with reference to FIGS. 8 and 9 may be omitted.

Referring to FIG. 10, a semiconductor package 2f may include the first semiconductor chip 230 disposed on the package base substrate 20, and first, second, third, and fourth stacked semiconductor chip structures 210a, 210b, 210c, and 210d disposed on the package base substrate 20 adjacent to the first semiconductor chip 230. The first, second, third, and fourth stacked semiconductor chip structures 210a, 210b, 210c, and 210d may be respectively disposed adjacent to first, second, third, and fourth edges 232a, 232b, 232c, and 232d of the first semiconductor chip 230. The first, second, third, and fourth stacked semiconductor chip structures 210a, 210b, 210c, and 210d may include penetrating electrode regions 226a and 227a, penetrating electrode regions 226b and 227b, penetrating electrode regions 226c and 227c, and penetrating electrode regions 226d and 227d, respectively. The plurality of penetrating electrodes 228 may be disposed in each of penetrating electrode regions 226a and 227a, penetrating electrode regions 226b and 227b, penetrating electrode regions 226c and 227c, and penetrating electrode regions 226d and 227d.

The semiconductor packages 2f and 2d of FIGS. 10 and 8 may be substantially the same as each other except that the semiconductor package 2f of FIG. 10 may include two penetrating electrode regions for each stacked semiconductor chip structure. The semiconductor package 2f may include the penetrating electrode regions 226a and 227a, the penetrating electrode regions 226b and 227b, the penetrating electrode regions 226c and 227c, and the penetrating electrode regions 226d and 227d for the first, second, third, and fourth stacked semiconductor chip structures 210a, 210b, 210c, and 210d, respectively. Thus, a more detailed description of the penetrating electrode regions of FIG. 2f may be omitted.

The penetrating electrode regions 226a and 227a, the penetrating electrode regions 226b and 227b, the penetrating electrode regions 226c and 227c, and the penetrating electrode regions 226d and 227d of the first, second, third, and fourth stacked semiconductor chip structures 210a, 210b, 210c, and 210d may respectively extend along the two edges 212a and 214a, the two edges 212b and 214b, the two edges 212c and 214c, and the two edges 212d and 214d of the first through fourth stacked semiconductor chip structures 210a, 210b, 210c, and 210d, which may respectively meet at the vertexes 216a, 216b, 216c, and 216d, and may be separated from each other around the vertexes 216a, 216b, 216c, and 216d, respectively.

Division of a penetrating electrode region into two or more portions may be selectively applied according to designs of the first through fourth stacked semiconductor chip structures 210a, 210b, 210c, and 210d, or may be applied to dispose a connection port electrically connecting the logic semiconductor chip described above with reference to FIG. 10 to the first semiconductor chip 230. Thus, the connection port may be adjacent to each of the vertexes 216a, 216b, 216c, and 216d.

Figure 11:
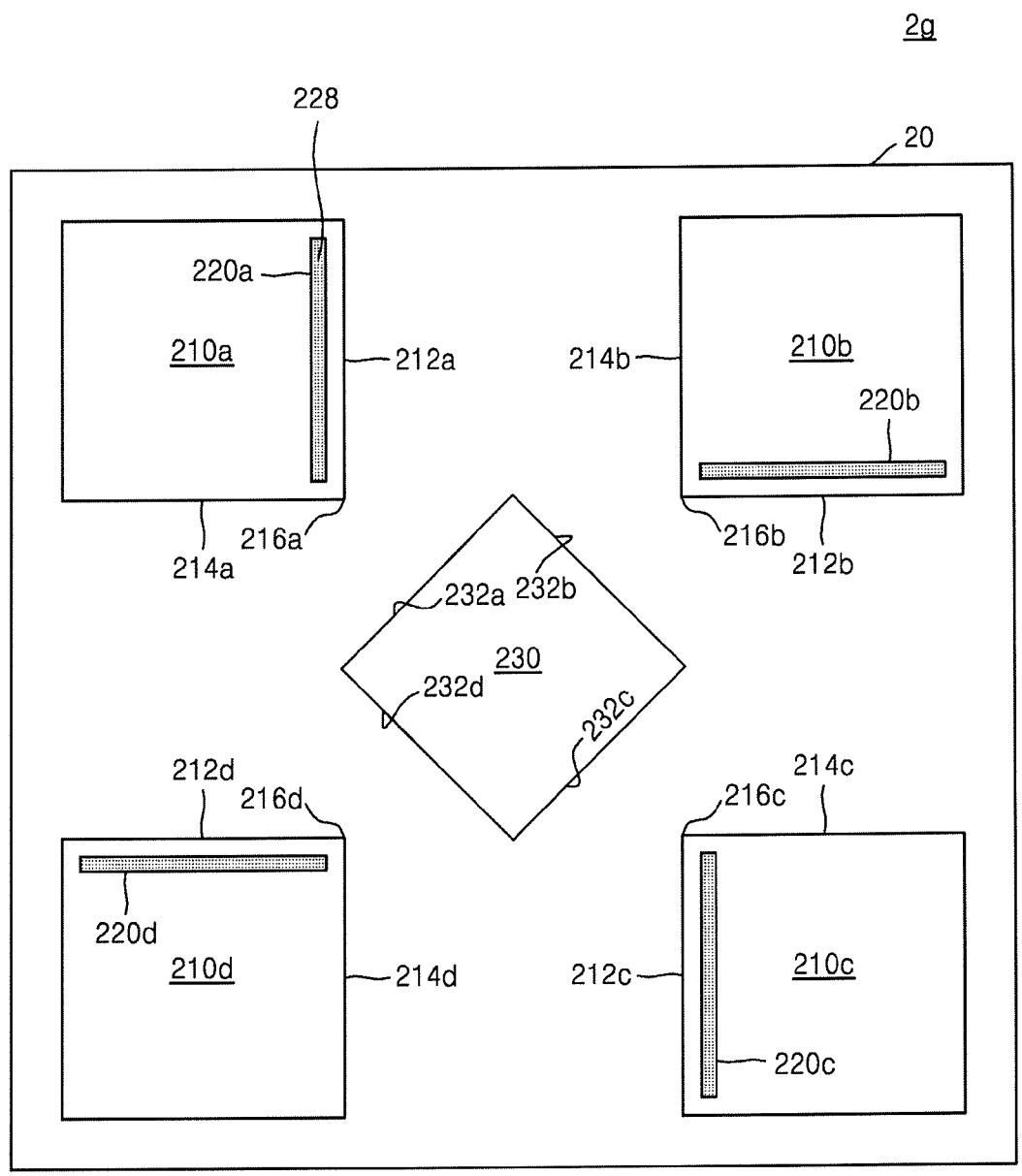
FIG. 11 is a planar view illustrating an arrangement of semiconductor chips included in a semiconductor package according to an exemplary embodiment of the present inventive concept.

FIG. 11 is a planar view illustrating an arrangement of semiconductor chips included in a semiconductor package according to an exemplary embodiment of the present inventive concept. A repeated description of components described above with reference to FIGS. 7 and 8 may be omitted.

Referring to FIG. 11, a semiconductor package 2g may include a first semiconductor chip 230 disposed on the package base substrate 20, and first, second, third, and fourth stacked semiconductor chip structures 210a, 210b, 210c, and 210d may be disposed on the package base substrate 20 adjacent to the first semiconductor chip 230. The first, second, third, and fourth stacked semiconductor chip structures 210a, 210b, 210c, and 210d may be respectively disposed adjacent to first, second, third, and fourth edges 232a, 232b, 232c, and 232d of the first semiconductor chip 230. The vertexes 216a, 216b, 216c, and 216d of the first through fourth stacked semiconductor chip structures 210a, 210b, 210c, and 210d may respectively face the first through fourth edges 232a, 232b, 232c, and 232d of the first semiconductor chip 230.

The first, second, third, and fourth stacked semiconductor chip structures 210a, 210b, 210c, and 210d may include penetrating electrode regions 220a, 220b, 220c, and 220d, respectively. The plurality of penetrating electrodes 228 may be disposed in each of the penetrating electrode regions 220a, 220b, 220c, and 220d. The penetrating electrode regions 220a, 220b, 220c, and 220d of the first through fourth stacked semiconductor chip structures 210a, 210b, 210c, and 210d may extend along edge 212a, edge 212b, edge 212c, and edge 212d of two edges 212a and 214a, two edges 212b and 214b, two edges 212c and 214c, and two edges 212c and 214c that respectively meet at respective vertexes 216a, 216b, 216c, and 216d of the first through fourth stacked semiconductor chip structures 210a, 210b, 210c, and 210d that face the first through fourth sides 232a, 232b, 232c, and 232d of the first semiconductor chip 230.

Figure 12:
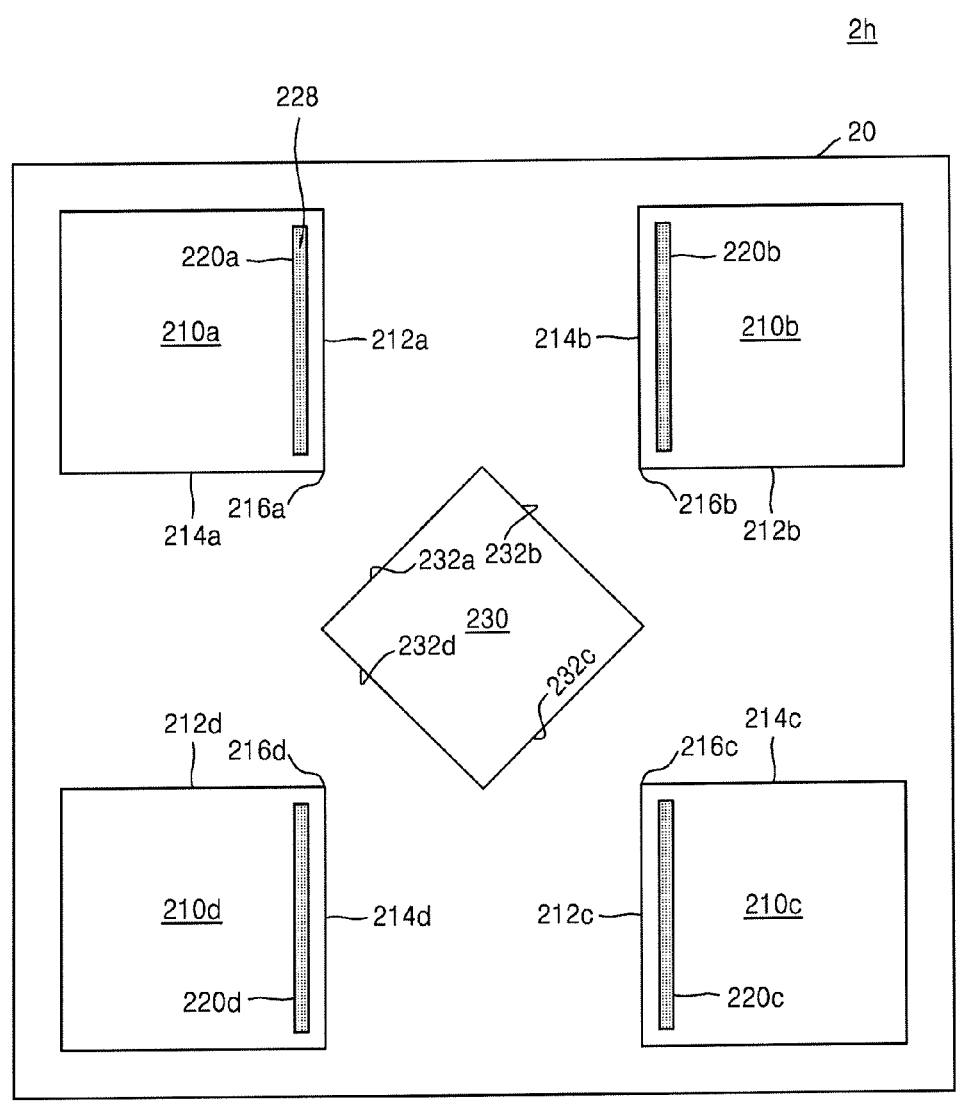
FIG. 12 is a planar view illustrating an arrangement of semiconductor chips included in a semiconductor package according to an exemplary embodiment of the present inventive concept.

FIG. 12 is a planar view illustrating an arrangement of semiconductor chips included in a semiconductor package according to an exemplary embodiment of the present inventive concept. A repeated description of components described above with reference to FIG. 11 may be omitted.

Referring to FIG. 12, a semiconductor package 2h may include the first semiconductor chip 230 disposed on the package base substrate 20, and first, second, third, and fourth stacked semiconductor chip structures 210a, 210b, 210c, and 210d disposed on the package base substrate 20 adjacent to the first semiconductor chip 230. The first, second, third, and fourth stacked semiconductor chip structures 210a, 210b, 210c, and 210d may be respectively disposed adjacent to first, second, third, and fourth edges 232a, 232b, 232c, and 232d of the first semiconductor chip 230. The vertexes 216a, 216b, 216c, and 216d of the first through fourth stacked semiconductor chip structures 210a, 210b, 210c, and 210d may respectively face the first through fourth edges 232a, 232b, 232c, and 232d of the first semiconductor chip 230.

The first, second, third, and fourth stacked semiconductor chip structures 210a, 210b, 210c, and 210d may include penetrating electrode regions 220a, 220b, 220c, and 220d, respectively. The plurality of penetrating electrodes 228 may be disposed in each of the penetrating electrode regions 220a, 220b, 220c, and 220d. The penetrating electrode regions 220a, 220b, 220c, and 220d of the first through fourth stacked semiconductor chip structures 210a, 210b, 210c, and 210d may extend along edge 212a, edge 214a, edge 212c, and edge 214d of two edges 212a and 214a, two edges 212b and 214b, two edges 212c and 214c, and two edges 212c and 214c that respectively meet at respective vertexes 216a, 216b, 216c, and 216d of the first through fourth stacked semiconductor chip structures 210a, 210b, 210c, and 210d that face the first through fourth sides 232a, 232b, 232c, and 232d of the first semiconductor chip 230.

Referring to FIGS. 11 and 12, in the semiconductor package 2g of FIG. 11, the first through fourth stacked semiconductor chip structures 210a, 210b, 210c, and 210d may be rotated. For example, the first through fourth stacked semiconductor chip structures 210a, 210b, 210c, and 210d may be rotated 90° clockwise. The first through fourth stacked semiconductor chip structures 210a, 210b, 210c, and 210d may be disposed around the first semiconductor chip 230. In the semiconductor package 2h of FIG. 12, the first and second stacked semiconductor chip structures 210a and 210b may be vertically symmetrical with the third and fourth stacked semiconductor chip structures 210c and 210d. Alternatively, the first and fourth stacked semiconductor chip structures 210a and 210d may be horizontally symmetrical with the second and third stacked semiconductor chip structures 210b and 210c. The first through fourth stacked semiconductor chip structures 210a, 210b, 210c, and 210d may be disposed around the first semiconductor chip 230.

For example, when a portion of the first semiconductor chip 230 generates a relatively large amount of heat, the first through fourth stacked semiconductor chip structures 210a, 210b, 210c, and 210d may be rotated or made symmetrical such that the portion of the first semiconductor chip 230 is adjacent to the penetrating electrode regions 220a, 220b, 220c, and 220d. Modifications may be made to the arrangements of the first through fourth stacked semiconductor chip structures 210a, 210b, 210c, and 210d, as desired.

Figure 13:
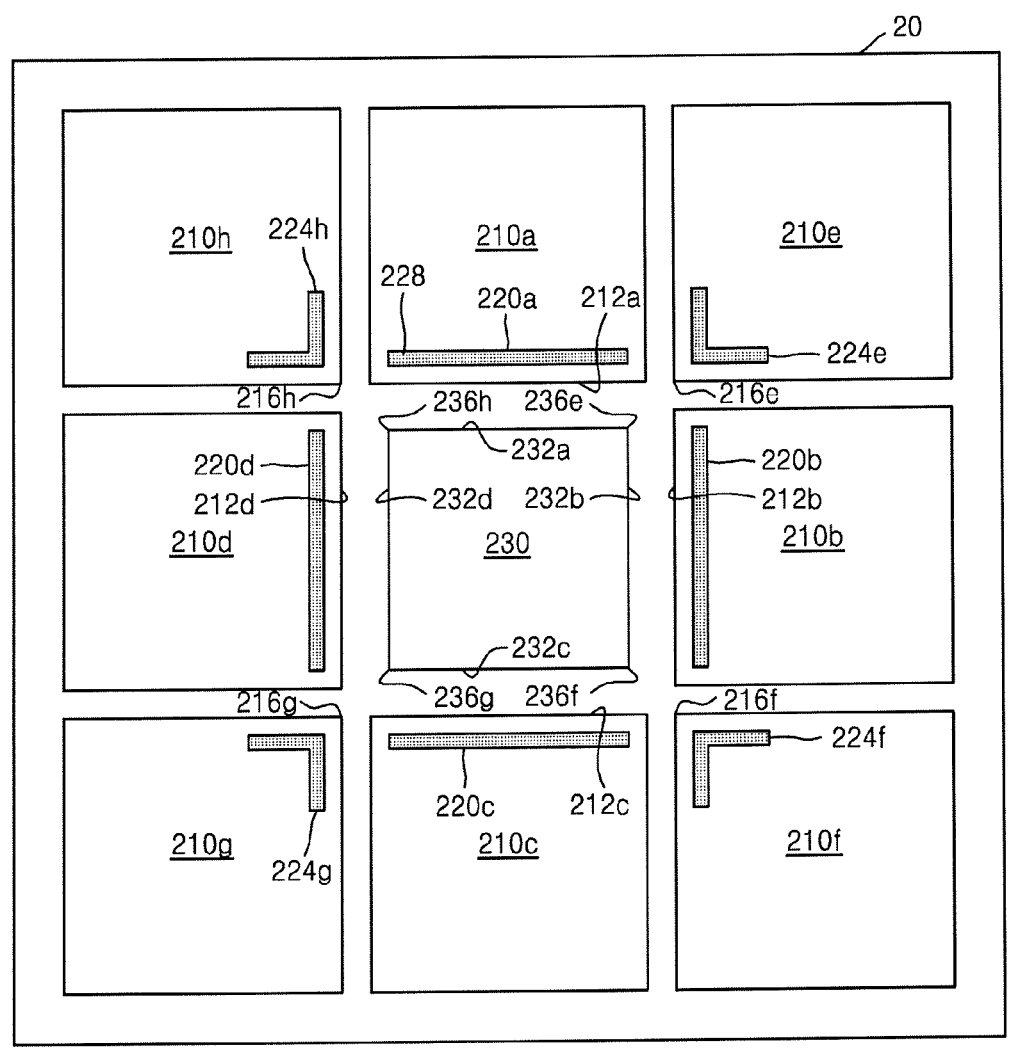
FIG. 13 is a planar view illustrating an arrangement of semiconductor chips included in a semiconductor package according to an exemplary embodiment of the present inventive concept.

FIG. 13 is a planar view illustrating an arrangement of semiconductor chips included in a semiconductor package according to an exemplary embodiment of the present inventive concept. A repeated description of components described above with reference to FIGS. 5-12 may be omitted.

Referring to FIG. 13, a semiconductor package 2i may include the first semiconductor chip 230 disposed on the package base substrate 20, and first, second, third, fourth, fifth, sixth, seventh, and eighth stacked semiconductor chip structures 210a, 210b, 210c, 210d, 210e, 210f, 210g, and 210h disposed on the package base substrate 20 adjacent to the first semiconductor chip 230. The edges 212a, 212b, 212c, and 212d of the first through fourth stacked semiconductor chip structures 210a, 210b, 210c, and 210d may respectively face the first through fourth edges 232a, 232b, 232c, and 232d of the first semiconductor chip 230. The fifth, sixth, seventh, and eighth stacked semiconductor chip structures 210e, 210f, 210g, and 210h may be respectively disposed adjacent to first, second, third, and fourth vertexes 236e, 236f, 236g, and 236h of the first semiconductor chip 230. Respective vertexes 216e, 216f, 216g, and 216h of the fifth through eighth stacked semiconductor chip structures 210e, 210f, 210g, and 210h may respectively face the first through fourth edges 236e, 236f, 236g, and 236h of the first semiconductor chip 230.

The first through fourth stacked semiconductor chip structures 210a, 210b, 210c, and 210d of FIG. 13 may include penetrating electrode regions 220a, 220b, 220c, and 220d, respectively. The plurality of penetrating electrodes 228 may be disposed in each of the penetrating electrode regions 220a, 220b, 220c, and 220d. The first through fourth stacked semiconductor chip structures 210a, 210b, 210c, and 210d may have the same structure as the structure of the first through fourth stacked semiconductor chip structures 210a, 210b, 210c, and 210d illustrated in FIG. 7.

The fifth through eighth stacked semiconductor chip structures 210e, 210f, 210g, and 210h of FIG. 13 may include penetrating electrode regions 220e, 220f, 220g, and 220h, respectively. The plurality of penetrating electrodes 228 may be disposed in each of the electrode regions 220e, 220f, 220g, and 220h. The fifth through eighth stacked semiconductor chip structures 210e, 210f, 210g, and 210h may have the same structure as the structure of the first through fourth stacked semiconductor chip structures 210a, 210b, 210c, and 210d illustrated in FIG. 9.

In the semiconductor package 2i of FIG. 13, the penetrating electrode regions 220a, 220b, 220c, and 220d of the first through fourth stacked semiconductor chip structures 210a, 210b, 210c, and 210d disposed adjacent to the first through fourth edges 232a, 232b, 232c, and 232d of the first semiconductor chip 230 may have different shapes than the penetrating electrode regions 220e, 220f, 220g, and 220h of the fifth through eighth stacked semiconductor chip structures 210e, 210f, 210g, and 210h disposed adjacent to the first through fourth vertexes 236e, 236f, 236g, and 236h of the first semiconductor chip 230. According to an exemplary embodiment of the present invention, the fifth through eighth stacked semiconductor chip structures 210e, 210f, 210g, and 210h may be replaced with the first through fourth stacked semiconductor chip structures 210a, 210b, 210c, and 210d of FIGS. 8, 10, 11, and 12.

Figure 14:
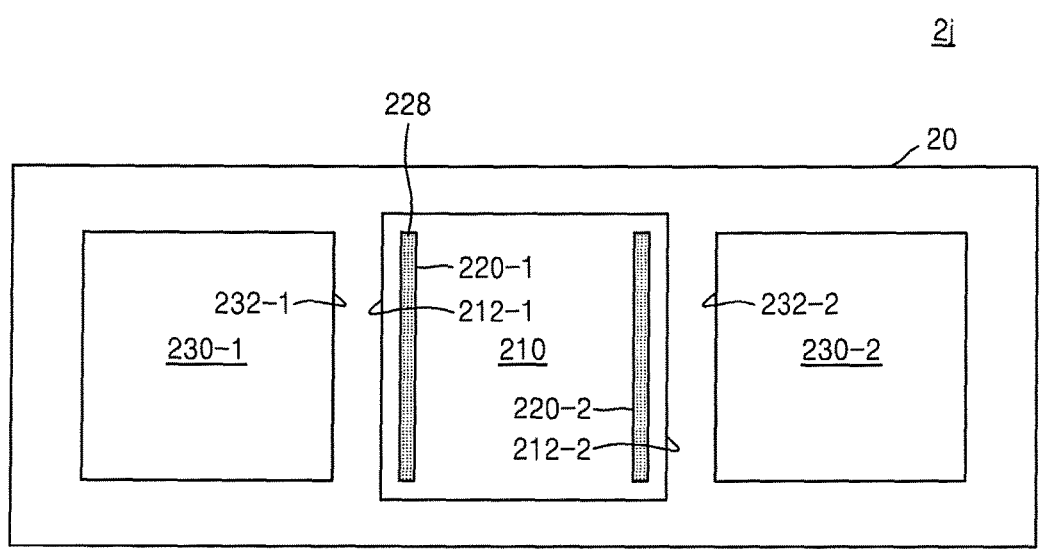
FIG. 14 is a planar view illustrating an arrangement of semiconductor chips included in a semiconductor package according to an exemplary embodiment of the present inventive concept.

FIG. 14 is a planar view illustrating an arrangement of semiconductor chips included in a semiconductor package according to an exemplary embodiment of the present inventive concept.

Referring to FIG. 14, a semiconductor package 2j may include the stacked semiconductor chip structure 210 disposed on the package base substrate 20, and two first semiconductor chips 230-1 and 230-2 which may be disposed on the package base substrate 20 adjacent to the stacked semiconductor chip structure 210. The first semiconductor chips 230-1 and 230-2 may be disposed adjacent to a first edge 212-1 and a second side 212-2, respectively, of the stacked semiconductor chip structure 210 that are opposite to each other. Respective edges 232-1 and 232-2 of the two first semiconductor chips 230-1 and 30-2 may face the first edge 212-1 and the second side 212-2, respectively, of the stacked semiconductor chip structure 210 that are opposite to each other.

Since each of the two first semiconductor chips 230-1 and 230-2 may include each of the sub-semiconductor packages 130a and 130b of FIGS. 1-4 and may be disposed on the package base substrate 20, a sub-semiconductor package including the first semiconductor chip 230-1 may be referred to as a first sub-semiconductor package, and a sub-semiconductor package including the first semiconductor chip 230-2 may be referred to as a second sub-semiconductor package.

The stacked semiconductor chip structure 210 may include penetrating electrode regions 220-1 and 220-2 respectively extending along the first edge 212-1 and the second edge 212-2 that are respectively adjacent to the two first semiconductor chips 230-1 and 230-2.

When the two first semiconductor chips 230-1 and 230-2 generate a larger amount of heat per unit area than the stacked semiconductor chip structure 210, heat transmitted toward the stacked semiconductor chip structure 210 from the heat generated by the two first semiconductor chips 230-1 and 230-2 may be discharged to the outside of the semiconductor package 2*j* via the penetrating electrodes 228. Accordingly, a concentration of heat may be reduced or prevented from occurring between the two first semiconductor chips 230-1 and 230-2 and the stacked semiconductor chip structure 210. The heat generated by the two first semiconductor chips 230-1 and 230-2 may be prevented from affecting an operation of a semiconductor device, for example, memory cells, included in the stacked semiconductor chip structure 210. Thus, operational reliability of the semiconductor package 2*j* may be increased.

Figure 15:
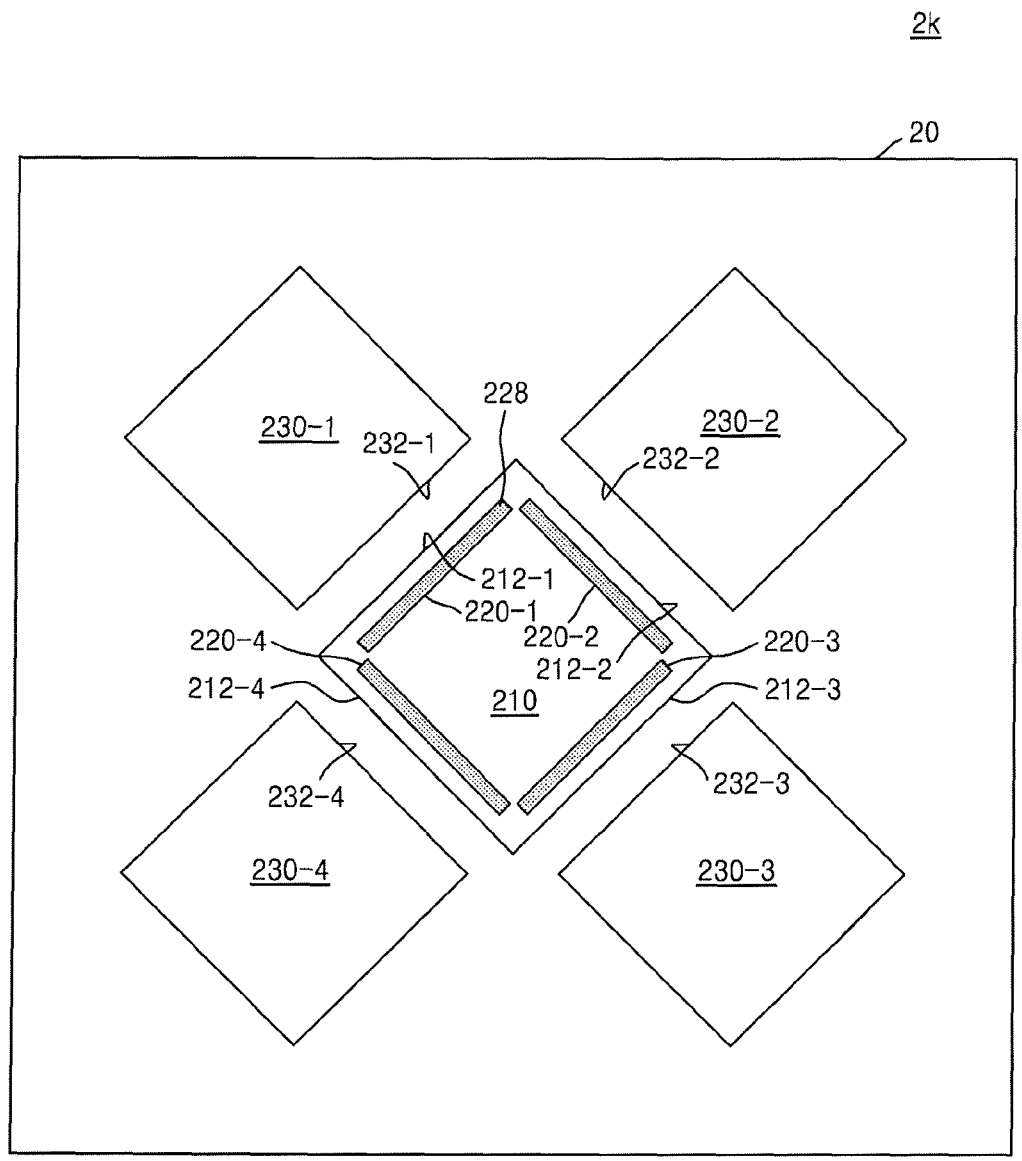
FIG. 15 is a planar view illustrating an arrangement of semiconductor chips included in a semiconductor package according to an exemplary embodiment of the present inventive concept.

FIG. 15 is a planar view illustrating an arrangement of semiconductor chips included in a semiconductor package according to an exemplary embodiment of the present inventive concept. A repeated description of components described above with reference to FIG. 14 may be omitted.

Referring to FIG. 15, a semiconductor package 2*k* may include the stacked semiconductor chip structure 210 disposed on the package base substrate 20, and first semiconductor chips 230-1, 230-2, 230-3, and 230-4 which may be disposed on the package base substrate 20 adjacent to the stacked semiconductor chip structure 210. The first semiconductor chips 230-1, 230-2, 230-3, and 230-4 may be disposed adjacent to first, second, third, and fourth edges 212-1, 212-2, 212-3, and 212-4, respectively, of the stacked semiconductor chip structure 210. Respective edges 232-1, 232-2, 232-3, and 232-4 of the four first semiconductor chips 230-1, 230-2, 230-3, and 230-4 may face the first through fourth edges 212-1, 212-2, 212-3, and 212-4, respectively, of the stacked semiconductor chip structure 210.

Since each of the four first semiconductor chips 230-1, 230-2, 230-3, and 230-4 may include each of the sub-semiconductor packages 130*a* and 130*b* of FIGS. 1-4 and may be disposed on the package base substrate 20, sub-semiconductor packages respectively including the first through fourth semiconductor chips 230-1, 230-2, 230-3, and 230-4 may be referred to as first through fourth sub-semiconductor packages, respectively.

The stacked semiconductor chip structure 210 may include penetrating electrode regions 220-1, 220-2, 220-3, and 220-4 respectively extending along the first through fourth edges 212-1, 212-2, 212-3, and 212-4 that are respectively adjacent to the four first semiconductor chips 230-1, 230-2, 230-3, and 230-4.

When the four first semiconductor chips 230-1, 230-2, 230-3, and 230-4 generate a larger amount of heat per unit area than the stacked semiconductor chip structure 210, heat transmitted toward the stacked semiconductor chip structure 210 from the heat generated by the four first semiconductor chips 230-1, 230-2, 230-3, and 230-4 may be discharged to the outside of the semiconductor package 2*k* via the penetrating electrodes 228. Accordingly, a concentration of heat may be reduced or prevented from occurring between the four first semiconductor chips 230-1, 230-2, 230-3, and 230-4 and the stacked semiconductor chip structure 210. The heat generated by the four first semiconductor chips 230-1, 230-2, 230-3, and 230-4 may be prevented from affecting an operation of a semiconductor device, for example, memory cells, included in the stacked semiconductor chip structure 210. Thus, operational reliability of the semiconductor package 2*k* may be increased.

Figure 16:
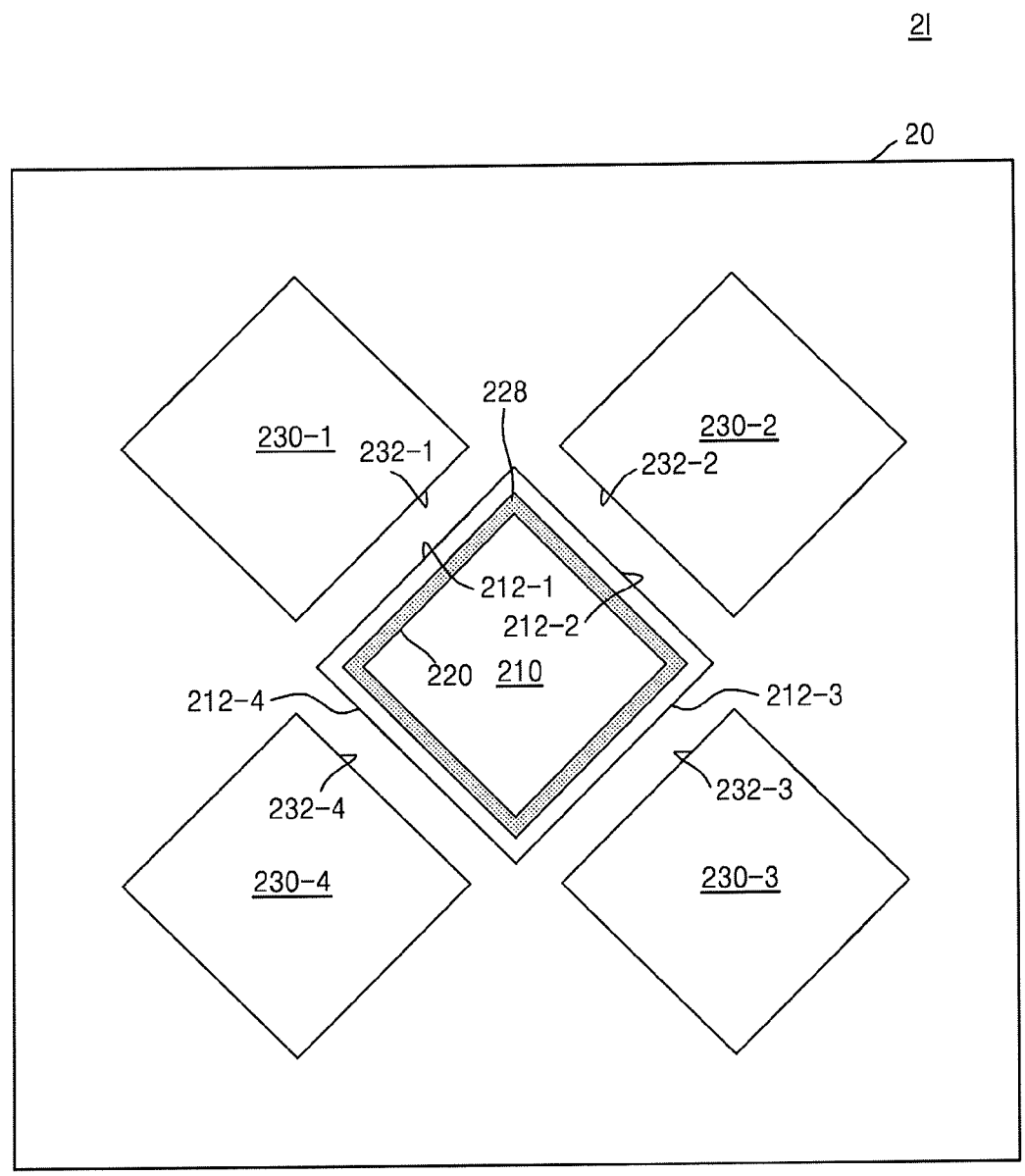
FIG. 16 is a planar view illustrating an arrangement of semiconductor chips included in a semiconductor package according to an exemplary embodiment of the present inventive concept.

FIG. 16 is a planar view illustrating an arrangement of semiconductor chips included in a semiconductor package according to an exemplary embodiment of the present inventive concept. A repeated description of components described above with reference to FIG. 15 may be omitted.

Referring to FIG. 16, a semiconductor package 2*l* may include the stacked semiconductor chip structure 210 disposed on the package base substrate 20, and first semiconductor chips 230-1, 230-2, 230-3, and 230-4 disposed on the package base substrate 20 adjacent to the stacked semiconductor chip structure 210.

The semiconductor package 2*k* of FIG. 15 and the semiconductor package 2*l* of FIG. 16 may be substantially the same as each other except that the penetrating electrode regions 220-1, 220-2, 220-3, and 220-4 of the stacked semiconductor package 210 of FIG. 15 respectively extending along the first through fourth edges 212-1, 212-2, 212-3, and 212-4 are separated from each other and the penetrating electrode region 220 of the stacked semiconductor package 210 of FIG. 16 extending along the first through fourth edges 212-1, 212-2, 212-3, and 212-4 is a single region. Thus, a more detailed description may be omitted.

Figure 17:
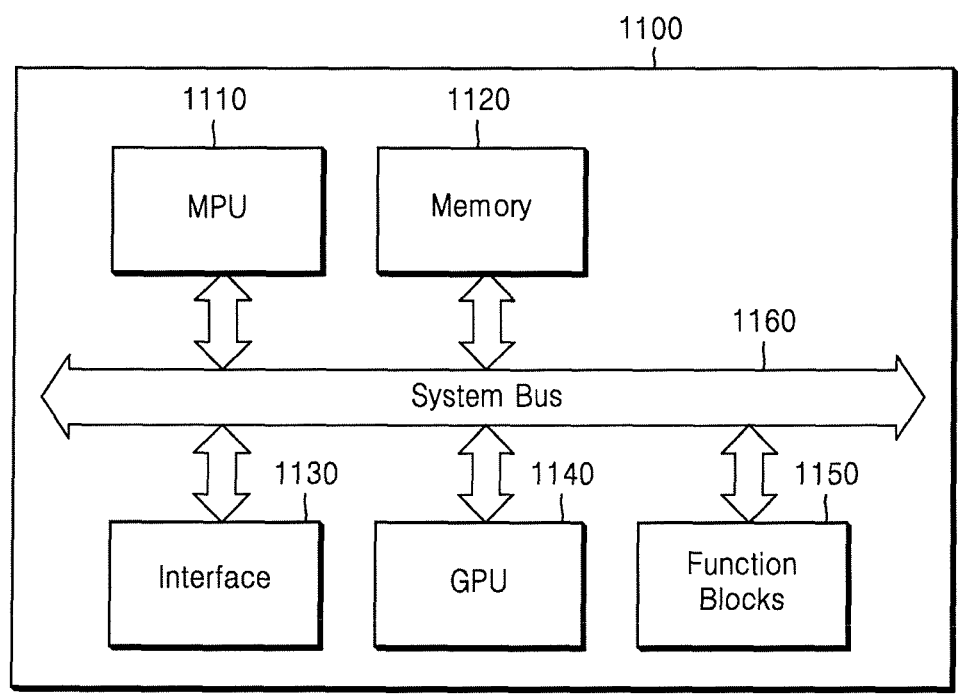
FIG. 17 is a block diagram illustrating a structure of a semiconductor package according to an exemplary embodiment of the present inventive concept.

FIG. 17 is a block diagram illustrating a structure of a semiconductor package according to an exemplary embodiment of the present inventive concept.

Referring to FIG. 17, a semiconductor package 1100 may include an MPU 1110, a memory 1120, an interface 1130, a GPU 1140, function blocks 1150, and a system bus 1160 via which the components may be connected to one another. The semiconductor package 1100 may include both the MPU 1110 and the GPU 1140 or may include either the MPU 1110 or the GPU 1140.

The MPU 1110 may include a core and an L2 cache. For example, the MPU 1110 may include multiple cores. The multiple cores may have substantially identical performances or different performances. The multiple cores may be activated at substantially the same time or at different times. The memory 1120 may store results of processes performed in the function blocks 1150, which may be under the control of the MPU 1110. For example, as the content stored in the L2 cache of the MPU 1110 is flushed, the memory 1120 may store the results of processes that are performed in the function blocks 1150. The interface 1130 may interface with external devices. For example, the interface 1130 may interface with a camera, a liquid crystal display (LCD), or a speaker.

The GPU 1140 may perform graphic functions. For example, the GPU 1140 may perform a video codec or process three-dimensional (3D) graphics.

The function blocks 1150 may perform various functions. For example, when the semiconductor package 1100 is an application processor (AP) for use in mobile devices, some of the function blocks 1150 may perform a communication function.

The semiconductor package 1100 may include one or more of the semiconductor packages 1*a*, 1*b*, 1*c*, 1*d*, 2*a*, 2*b*, 2*c*, 2*d*, 2*e*, 2*f*, 2*g*, 2*h*, 2*i*, 2*j*, 2*k*, and 2*l* of FIGS. 1-16. The MPU 1110 and/or the GPU 1140 may include one or more of the first semiconductor chips 130, 130-1, 130-2, 130-3, and 130-4 of FIGS. 1-16. The memory 1120 may include one or more of the stacked semiconductor chip structures 100*a*, 100*b*, 210, 210*a*, 210*b*, 210*c*, 210*d*, 210*e*, 210*f*, 210*g*, and 210*h* of FIGS. 1-16, or may be at least one selected from the plurality of second semiconductor chips 110*a*, 110*b*, 110*c*, 110*d*, and 110*e* including one or more of the stacked semiconductor chip structures 100*a*, 100*b*, 210, 210*a*, 210*b*, 210*c*, 210*d*, 210*e*, 210*f*, 210*g*, and 210*h*.

The interface 1130 and the function blocks 1150 may include one or more of the first semiconductor chips 130, 130-1, 130-2, 130-3, and 130-4, or may include the second semiconductor chip 110e, which may be a logic semiconductor chip.

Since the semiconductor package 1100 may include both the MPU 1110 and/or the GPU 1140 and the memory 1120 and may discharge heat generated by the MPU 1110 and/or the GPU 1140 to the outside of the semiconductor package 1100, a partial concentration of heat may be reduced or prevented from occurring within the semiconductor package 1100, and thus operational reliability of the semiconductor package 1100 may be increased. Therefore, the semiconductor package 1100 may have relatively high capacity, relatively high performance, and relatively high reliability.

Figure 18:
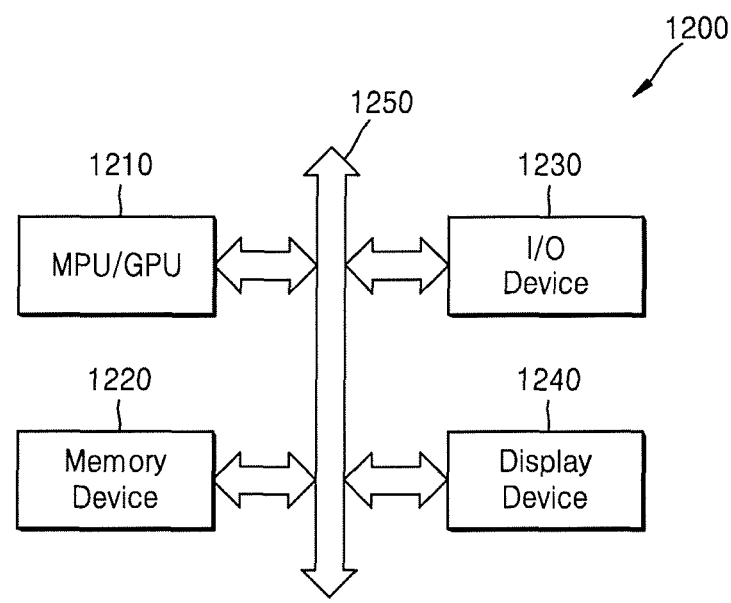
FIG. 18 is a block diagram of an electronic system including a semiconductor package, according to an exemplary embodiment of the present inventive concept.

FIG. 18 is a block diagram of an electronic system 1200 including a semiconductor package, according to an exemplary embodiment of the present inventive concept.

Referring to FIG. 38, the electronic system 1200 may include an MPU/GPU 1210. The electronic system 1200 may be, for example, a mobile apparatus, a desktop computer, or a server. The electronic system 1200 may include a memory device 1220, an input/output (I/O) device 1230, and a display device 1240, which may be connected to one another via a bus 1250. The MPU/GPU 1210 and the memory device 1220 may include one or more of the semiconductor packages 1a, 1b, 1c, 1d, 2a, 2b, 2c, 2d, 2e, 2f, 2g, 2h, 2i, 2j, 2k, and 2l of FIGS. 1-16.

The electronic system 1200 may reduce or prevent reliability degradation from occurring due to internal heat generation in the electronic system including the MPU/GPU 1210 having high performance and the memory device 1220 having high capacity.

Figure 19:
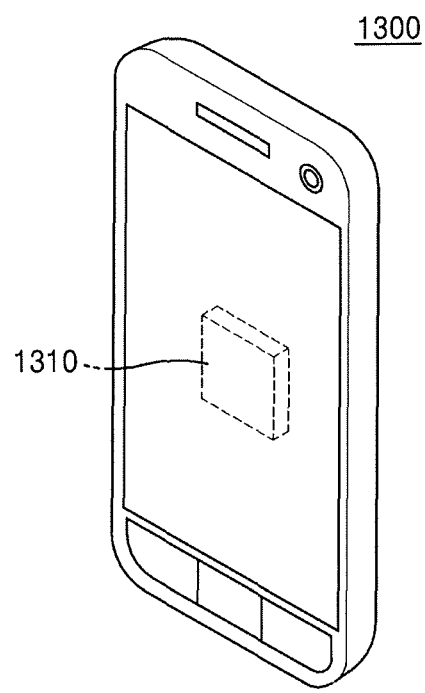
FIG. 19 is a perspective view of an electronic device including a semiconductor package according to an exemplary embodiment of the present inventive concept is applied.

FIG. 19 is a perspective view of an electronic device including a semiconductor package according to an exemplary embodiment of the present inventive concept is applied.

FIG. 19 illustrates an example in which the electronic system 1200 of FIG. 18 is included in a mobile phone 1300. The mobile phone 1300 may include a semiconductor package 1310. The semiconductor package 1310 may include one or more of the semiconductor packages 1a, 1b, 1c, 1d, 2a, 2b, 2c, 2d, 2e, 2f, 2g, 2h, 2i, 2j, 2k, and 2l of FIGS. 1-16.

The mobile phone 1300 may include the semiconductor package 1310 including a high-performance MPU/GPU and a high-capacity memory device, and the semiconductor package 1310 may be highly reliable. The mobile phone 1300 may be relatively compact and may have high performance.

The electronic system 1200 may be used, for example, in portable notebooks, MP3 players, navigation systems, solid state disks (SSDs), cars, or household appliances.

In a semiconductor package according to an exemplary embodiment of the present inventive concept, a penetrating electrode region of a stacked semiconductor chip structure may be adjacent to a semiconductor chip that generates a large amount of heat, and thus partial heat concentration may be reduced or prevented from occurring within the semiconductor package. Therefore, operational reliability of the semiconductor package may be increased.

While the present inventive concept has been particularly shown and described with reference to exemplary embodiments thereof, it will be understood that various changes in form and details may be made therein without departing from the spirit and scope of the present inventive concept.

What is claimed is:

1. A semiconductor package comprising:
   a package base substrate;
   at least one first semiconductor chip disposed on the package base substrate; and
   at least one stacked semiconductor chip structure disposed on the package base substrate adjacent to the at least one first semiconductor chip, wherein the at least one stacked semiconductor chip comprises a plurality of stacked second semiconductor chips, and
   wherein a penetrating electrode region of the at least one stacked semiconductor chip structure comprises a plurality of penetrating electrodes vertically stacked along an edge of the at least one stacked semiconductor chip structure facing the at least one first semiconductor chip, wherein the at least one first semiconductor chip is adjacent to the plurality of penetrating electrodes, and wherein the plurality of penetrating electrodes is positioned to discharge heat from the first semiconductor chip.

2. The semiconductor package of claim 1, further comprising a package molding layer disposed on the package base substrate, wherein the package molding layer covers a side surface of the at least one first semiconductor chip facing the plurality of penetrating electrodes and the edge of the at least one stacked semiconductor chip structure but not an upper surface of the at least one first semiconductor chip and an upper surface of the at least one stacked semiconductor chip structure, and
   wherein the upper surface of the at least one first semiconductor chip is on the same level as the upper surface of the at least one stacked semiconductor chip structure.

3. The semiconductor package of claim 2, further comprising a heat dissipation member disposed on the at least one first semiconductor chip and the at least one stacked semiconductor chip structure, and a thermal interface material (TIM) layer disposed between the heat dissipation member and the at least one first semiconductor chip and the at least one stacked semiconductor chip structure.

4. The semiconductor package of claim 3, wherein the plurality of penetrating electrodes disposed on an uppermost semiconductor chip among the plurality of second semiconductor chips is in contact with the TIM layer.

5. The semiconductor package of claim 1, further comprising a second penetrating electrode region adjacent to an edge of the at least one stacked semiconductor chip structure that is opposite to the at least one first semiconductor chip.

6. The semiconductor package of claim 1, wherein the at least one stacked semiconductor chip structure comprises first and second stacked semiconductor chip structures, and
   wherein an edge of the first stacked semiconductor chip structure and an edge of the second stacked semiconductor chip structure face two opposite edges of the at least one first semiconductor chip, respectively.

7. The semiconductor package of claim 1, wherein the at least one first semiconductor chip is a microprocessor unit (MPU) or a graphics processing unit (GPU).

8. The semiconductor package of claim 1, wherein the plurality of second semiconductor chips includes memory semiconductor chips.

9. The semiconductor package of claim 1, wherein the plurality of second semiconductor chips comprises a logic semiconductor chip and a plurality of memory semiconductor chips stacked on the logic semiconductor chip.

10. The semiconductor package of claim 1, wherein the at least one first semiconductor chip is configured to generate a larger amount of heat per unit area than each of the plurality of second semiconductor chips.

11. A semiconductor package comprising:
a package base substrate;
a first semiconductor chip disposed on the package base substrate, wherein the first semiconductor chip is a single semiconductor chip;
at least one stacked semiconductor chip structure disposed on the package base substrate adjacent to the first semiconductor chip, wherein the at least one stacked semiconductor comprises a plurality of stacked second semiconductor chips, wherein each of the plurality of second semiconductor chips comprises a penetrating electrode region, and wherein a plurality of penetrating electrodes is disposed in the penetrating electrode region, wherein an upper surface of the first semiconductor chip is substantially aligned with an upper surface of an uppermost semiconductor chip of the stacked second semiconductor chips;
a package molding layer disposed on the package base substrate, wherein the package molding layer covers a side surface of the first semiconductor chip and a side surface of the at least one stacked semiconductor chip structure; and
a heat dissipation member disposed on the first semiconductor chip and the at least one stacked semiconductor chip structure, wherein a thermal interface material (TIM) layer is disposed between the heat dissipation member and the first semiconductor chip and the at least one stacked semiconductor chip structure, and
wherein the penetrating electrode region is adjacent to an edge of the at least one stacked semiconductor chip structure that is adjacent to an edge of the at least one first semiconductor chip.

12. The semiconductor package of claim 11, wherein the penetrating electrode region is adjacent to two opposite edges of the at least one stacked semiconductor chip structure, and
wherein the first semiconductor chip comprises a first sub-semiconductor package and a second sub-semiconductor package.

13. The semiconductor package of claim 11, wherein the TIM layer is in contact with the upper surface of the first semiconductor chip and the upper surface of the uppermost semiconductor chip among the plurality of second semiconductor chips.

14. A semiconductor package comprising:
a package base substrate;
a first semiconductor chip disposed on the package base substrate;
a plurality of second semiconductor chips disposed on the package base substrate adjacent to the first semiconductor chip, wherein each of the plurality of second semiconductor chips is vertically stacked, wherein each of the plurality of second semiconductor chips is electrically connected to one another via a plurality of penetrating electrodes, wherein the plurality of penetrating electrodes are each disposed in a through silicon via disposed adjacent to an outermost lateral edge of the plurality of vertically stacked second semiconductor chip facing an outermost lateral edge of the first semiconductor chip and wherein the plurality of penetrating electrodes are positioned to discharge heat from the first semiconductor chip;
a molding layer disposed on the package base substrate, wherein the molding layer covers a side surface of the first semiconductor chip and side surfaces of the plurality of the second semiconductor chips; and
a heat dissipation member disposed on the molding layer.

15. The semiconductor package of claim 14, wherein the a second plurality of penetrating electrodes is disposed along an edge of the plurality of second semiconductor chips that is opposite to the first semiconductor chip.

16. The semiconductor package of claim 14, wherein the molding layer does not cover an upper surface of the first semiconductor chip and an upper surface of an uppermost semiconductor chip among the plurality of second semiconductor chips that are on the same level as each other with respect to the package base substrate,
wherein the heat dissipation member is disposed on the first semiconductor chip and the plurality of second semiconductor chips, and
wherein a thermal interface material (TIM) layer is disposed between the heat dissipation member and the first semiconductor chip and the plurality of second semiconductor chips.

* * * * *